(12) United States Patent
Suzawa et al.

(10) Patent No.: US 8,653,513 B2
(45) Date of Patent: Feb. 18, 2014

(54) SEMICONDUCTOR DEVICE WITH SIDEWALL INSULATING LAYER

(75) Inventors: Hideomi Suzawa, Atsugi (JP); Shinya Sasagawa, Chigasaki (JP); Motomu Kurata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 82 days.

(21) Appl. No.: 13/029,146

(22) Filed: Feb. 17, 2011

(65) Prior Publication Data

US 2011/0210326 A1     Sep. 1, 2011

(30) Foreign Application Priority Data

Feb. 26, 2010    (JP) ................ 2010-043137

(51) Int. Cl.
*H01L 29/78*      (2006.01)
(52) U.S. Cl.
USPC ............. 257/43; 257/E29.296; 257/330
(58) Field of Classification Search
USPC ............. 257/43, 288, 330, 332, E29.255, 257/E29.296, E29.273; 438/104, 300
See application file for complete search history.

(56) References Cited

U.S. PATENT DOCUMENTS

| | | | |
|---|---|---|---|
| 5,648,662 A | 7/1997 | Zhang et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,238,557 B2 | 7/2007 | Hayakawa |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

International Search Report (Application No. PCT/JP2011/052449) Dated Mar. 1, 2011.

(Continued)

*Primary Examiner* — Tucker Wright
(74) *Attorney, Agent, or Firm* — Eric J. Robinson; Robinson Intellectual Property Law Office, P.C.

(57) ABSTRACT

A semiconductor device includes an oxide semiconductor layer, a source electrode and a drain electrode in contact with the oxide semiconductor layer, a gate electrode overlapping with the oxide semiconductor layer, and a gate insulating layer between the oxide semiconductor layer and the gate electrode, in which the source electrode or the drain electrode comprises a first conductive layer and a second conductive layer having a region which extends beyond an end portion of the first conductive layer in a channel length direction and which overlaps with part of the gate electrode, in which a sidewall insulating layer is provided over the extended region of the second conductive layer, and in which the sidewall insulating layer comprises a stack of a plurality of different material layers.

28 Claims, 8 Drawing Sheets

(56) References Cited

U.S. PATENT DOCUMENTS

| | | | |
|---|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,598,520 B2 | 10/2009 | Hirao et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056826 A1 | 3/2005 | Appenzeller et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048183 A1 | 2/2008 | Ohsawa et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134383 A1 | 5/2009 | Imahayashi et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0003783 A1 | 1/2010 | Akimoto |
| 2010/0032665 A1 | 2/2010 | Yamazaki et al. |
| 2010/0032668 A1 | 2/2010 | Yamazaki et al. |
| 2010/0038639 A1 | 2/2010 | Akimoto |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0297809 A1 | 11/2010 | Imahayashi et al. |
| 2011/0042744 A1 | 2/2011 | Cheng et al. |
| 2011/0133177 A1 | 6/2011 | Suzawa et al. |
| 2011/0180796 A1 | 7/2011 | Yamazaki et al. |
| 2011/0193080 A1* | 8/2011 | Yamazaki et al. ............... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| WO | WO-2004/114391 | 12/2004 |
| WO | WO-2007/058329 | 5/2007 |
| WO | WO-2007/089048 | 8/2007 |
| WO | WO-2007/142167 | 12/2007 |

OTHER PUBLICATIONS

Written Opinion (Application No. PCT/JP2011/052449) Dated Mar. 1, 2011.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)_m$) (m natural number) and related compounds,", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor,", Science, May 23, 2003, vol. 300, No. 5623, pp. 1269-1272.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops; Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID DIGEST '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K at al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

SEMICONDUCTOR DEVICE WITH SIDEWALL INSULATING LAYER

TECHNICAL FIELD

A technical field of the present invention relates to a semiconductor device. Note that a semiconductor device herein refers to elements and devices in general which function by utilizing semiconductor characteristics.

BACKGROUND ART

There are a wide variety of metal oxides and such metal oxides are used for various applications. Indium oxide is a well-known material and has been used as a transparent electrode material which is necessary in liquid crystal display devices or the like.

Some metal oxides have semiconductor characteristics. The examples of such metal oxides having semiconductor characteristics are tungsten oxide, tin oxide, indium oxide, zinc oxide, and the like. A thin film transistor in which a channel formation region is formed using such metal oxide has been already known (for example, see Patent Documents 1 to 4, Non-Patent Document 1, and the like).

As metal oxides, not only single-component oxides but also multi-component oxides are known. For example, $InGaO_3(ZnO)_m$ (m is a natural number) having a homologous series is known as a multi-component oxide containing In, Ga, and Zn (also referred to as In—Ga—Zn-based oxide) (e.g. see Non-Patent Documents 2 to 4 and the like).

Furthermore, it is confirmed that an oxide semiconductor including an In—Ga—Zn-based oxide is applicable to a channel formation region of a thin film transistor (for example, see Patent Document 5, Non-Patent Documents 5 and 6, and the like).

REFERENCE

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

NON-PATENT DOCUMENT

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

In order to achieve high-speed operation, low power consumption, cost reduction, or the like of a transistor, it is necessary to miniaturize a transistor.

In miniaturization of a transistor, a defect generated in the manufacturing process becomes a serious problem. For example, although a source electrode, a drain electrode, and a channel formation region should be electrically connected, breakage, connection failure, or the like may occur due to a reduction in coverage by the miniaturization.

Further, in miniaturization of a transistor, a short-channel effect becomes problematic. The short-channel effect refers to degradation of electrical characteristics which becomes pronounced as a transistor is miniaturized (a channel length (L) is reduced). The short-channel effect results from influence of an electric field of a drain on a source. Specific examples of the short-channel effect include a decrease in threshold voltage, an increase in subthreshold swing (S value), an increase in leakage current, and the like. In particular, it is known that a transistor including an oxide semiconductor has lower off-state current than a transistor including silicon at room temperature. It is considered that this is because the number of carriers generated by thermal excitation is small, that is, the carrier density is low. In a transistor including a material having a low carrier density, a short-channel effect like a decrease in threshold voltage is likely to be caused.

In view of this, it is an object of one embodiment of the disclosed invention to provide a semiconductor device which suppresses defects and achieves miniaturization. Further, it is another object of one embodiment of the disclosed invention to provide a semiconductor device which maintains favorable characteristics and achieves miniaturization.

One embodiment of the present invention is a semiconductor device including an oxide semiconductor layer, a source electrode and a drain electrode in contact with the oxide semiconductor layer, a gate electrode overlapping with the oxide semiconductor layer, and a gate insulating layer between the oxide semiconductor layer and the gate electrode, in which the source electrode or the drain electrode comprises a first conductive layer and a second conductive layer having a region which extends beyond an end portion of the first conductive layer in a channel length direction and which overlaps with part of the gate electrode, in which a sidewall insulating layer is provided over the extended region of the second conductive layer, and in which the sidewall insulating layer comprises a stack of a plurality of different material layers.

In the above, the plurality of different material layers in the sidewall insulating layer preferably includes a stack of a nitride insulating layer and an oxide insulating layer. In addition, the oxide insulating layer is preferably provided over the nitride insulating layer in the sidewall insulating layer.

In the above, the nitride insulating layer is preferably a film including silicon nitride, silicon nitride oxide, or aluminum nitride and the oxide insulating layer is preferably a film including silicon oxide, silicon oxynitride, or aluminum oxide.

In the above, the first conductive layer and the second conductive layer may each have a tapered shape. The second conductive layer may include nitride of a metal. The second conductive layer may have a thickness of greater than or equal to 5 nm and less than or equal to 15 nm.

Further, in the above, the source electrode or the drain electrode may be in contact with the oxide semiconductor layer at an end portion of the source electrode or the drain electrode, and an insulating layer may be provided between a top surface of the source electrode or the drain electrode and the oxide semiconductor layer.

The semiconductor device herein refers to devices in general which function by utilizing semiconductor characteristics. For example, a display device, a memory device, an integrated circuit, and the like are included in the category of the semiconductor device.

Note that in this specification and the like, the term such as "over" or "below" does not necessarily mean that a component is placed "directly over" or "directly below" another component. For example, the expression "a gate electrode over a gate insulating layer" does not exclude the case where another component is provided between the gate insulating layer and the gate electrode.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

Further, functions of a "source" and a "drain" are sometimes interchanged with each other when a transistor of opposite polarity is used or when the direction of current flow is changed in circuit operation, for example. Therefore, the terms "source" and "drain" can be interchanged in this specification.

Note that in this specification and the like, the term "electrically connected" includes the case where components are connected through an object having any electric function. There is no particular limitation on the object having any electric function as long as electric signals can be transmitted and received between the components connected through the object. Examples of the object having any electric function include a switching element such as a transistor, a resistor, an inductor, a capacitor, and an element with a variety of functions as well as an electrode and a wiring.

According to one embodiment of the disclosed invention, either one or both of the following effects can be obtained.

Firstly, the coverage with the semiconductor layer over the source or drain electrode is improved by providing the source or drain electrode having a stacked-layer structure including the first conductive layer and the second conductive layer and the second conductive layer having a region which extends beyond an end portion of the first conductive layer in the channel length direction and which overlaps with part of the gate electrode. Therefore, occurrence of connection failure or the like is suppressed.

Secondly, an electric field between the source electrode and the drain electrode can be relaxed by forming the vicinity of a region in the source or drain electrode which is in contact with a channel formation region to be a high-resistance region. Therefore, a short-channel effect such as a decrease in threshold voltage can be suppressed.

By the above effects, the problems which are caused due to miniaturization are solved. As a result, it is possible to sufficiently reduce the size of a transistor. By sufficiently reducing the size of a transistor, the area occupied by a semiconductor device is reduced and the number of semiconductor devices which can be manufactured using one substrate is increased. Accordingly, the manufacturing cost per semiconductor device is suppressed. Further, the size of the semiconductor device can be reduced without its function degrading; therefore, the semiconductor device of the same size can have improved functions. Moreover, advantageous effects such as high-speed operation and low power consumption due to a reduction in channel length can be obtained. In other words, according to one embodiment of the disclosed invention, miniaturization of a transistor including an oxide semiconductor is achieved, and a variety of advantageous effects accompanying it can be obtained.

Further, by forming the sidewall insulating layer including different material layers in the transistor, variation in the thickness of the second conductive layer can be reduced. This can reduce variation in the contact area between the second conductive layer and the oxide semiconductor layer, and thus variation in electrical characteristics of transistors across the substrate plane can be reduced.

As described above, according to one embodiment of the disclosed invention, a semiconductor device which suppresses defects or maintains favorable characteristics, and achieves miniaturization can be provided.

BEST MODE FOR CARRYING OUT THE INVENTION

Figure 1:
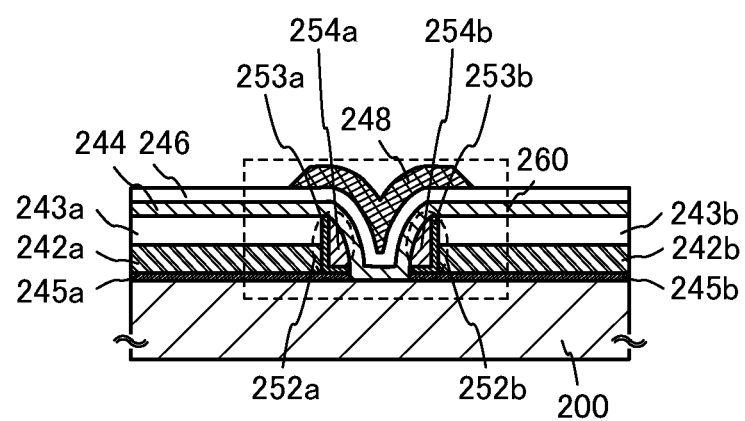
FIG. 1 is a cross-sectional view of a semiconductor device.

Hereinafter, embodiments of the present invention are described with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below.

Note that the position, the size, the range, or the like of each structure illustrated in drawings and the like is not accurately represented in some cases for easy understanding. The disclosed invention is thus not necessarily limited by the position, size, range, or the like illustrated in the drawings and the like.

In this specification and the like, ordinal numbers such as "first", "second", and "third" are used in order to avoid confusion among components, and the terms do not limit the components numerically.

Embodiment 1

In this embodiment, an example of a structure of a semiconductor device and a manufacturing process according to one embodiment of the disclosed invention will be described with reference to FIG. 1, FIGS. 2A to 2D, FIGS. 3A to 3D, and FIGS. 4A to 4C.

<Example of Structure of Semiconductor Device>

FIG. 1 illustrates a cross-sectional structure of a transistor as an example of a semiconductor device. FIG. 1 illustrates a top-gate transistor as a transistor according to one embodiment of the disclosed invention.

A transistor 260 illustrated in FIG. 1 includes, over a substrate 200, a source electrode in which a second conductive layer 245a and a first conductive layer 242a are sequentially stacked, a drain electrode in which a second conductive layer 245b and a first conductive layer 242b are sequentially stacked, a sidewall insulating layer 252a in contact with the source electrode, a sidewall insulating layer 252b in contact with the drain electrode, an insulating layer 243a over the source electrode, an insulating layer 243b over the drain electrode, an oxide semiconductor layer 244 over the insulating layer 243a, the insulating layer 243b, the sidewall insulating layer 252a, the sidewall insulating layer 252b, and the substrate 200, a gate insulating layer 246 over the oxide semiconductor layer 244, and a gate electrode 248 over the gate insulating layer 246.

In the transistor 260 illustrated in FIG. 1, the second conductive layer 245a includes a region which extends beyond an end portion of the first conductive layer 242a in the channel length direction and which overlaps with part of the gate electrode. The second conductive layer 245a is in contact with at least a channel formation region of the oxide semiconductor layer 244. Further, the second conductive layer 245b includes a region which extends beyond an end portion of the first conductive layer 242b in the channel length direction and which overlaps with part of the gate electrode. The second conductive layer 245b is in contact with at least the channel formation region of the oxide semiconductor layer 244.

Furthermore, the transistor 260 illustrated in FIG. 1 includes the sidewall insulating layer 252a over the region of the second conductive layer 245a which extends beyond the end portion of the first conductive layer 242a in the channel length direction and which overlaps with part of the gate electrode, and the sidewall insulating layer 252b over the region of the second conductive layer 245b which extends beyond the end portion of the first conductive layer 242b in the channel length direction and which overlaps with part of the gate electrode.

The sidewall insulating layer 252a has a stacked-layer structure of an insulating layer 253a and an insulating layer 254a. The insulating layer 253a is provided in contact with the second conductive layer 245a, the first conductive layer 242a, and the insulating layer 243a. The insulating layer 254a is provided in contact with the oxide semiconductor layer 244 and has a curved surface at least partly in a region in contact with the oxide semiconductor layer 244. Similarly, the sidewall insulating layer 252b has a stacked-layer structure of an insulating layer 253b and an insulating layer 254b. The insulating layer 253b is provided in contact with the second conductive layer 245b, the first conductive layer 242b, and the insulating layer 243b. The insulating layer 254b is provided in contact with the oxide semiconductor layer 244 and has a curved surface at least partly in a region in contact with the oxide semiconductor layer 244.

<Example of Manufacturing Process of Transistor>

An example of a manufacturing process of the transistor illustrated in FIG. 1 will be described below with reference to FIGS. 2A to 2E and FIGS. 3A to 3D.

First, a second conductive film 245 is formed over the substrate 200 having an insulating surface. Then, a first conductive film 242 is formed over the second conductive film 245 and an insulating film 243 is formed over the first conductive film 242 (see FIG. 2A).

There is no particular limitation on a substrate that can be used as the substrate 200 as long as it has heat resistance high enough to withstand at least heat treatment performed later. For example, a glass substrate, a ceramic substrate, a quartz substrate, or a sapphire substrate can be used. Alternatively, a single crystal semiconductor substrate or a polycrystalline semiconductor substrate of silicon, carbon silicon, or the like; a compound semiconductor substrate of silicon germanium or the like; an SOI substrate; or the like can be used as long as the substrate has an insulating surface. Semiconductor elements may be provided over these substrates. Further, a base film may be provided over the substrate 200.

The thickness of the second conductive film 245 is 3 nm to 30 nm inclusive, preferably 5 nm to 15 nm inclusive. The second conductive film 245 can be formed by a PVD method such as a sputtering method or a CVD method such as a plasma CVD method.

As a material of the second conductive film 245, an element selected from aluminum, chromium, copper, tantalum, titanium, molybdenum, and tungsten; a nitride thereof; an alloy containing any of the above elements as its component; or the like can be used. A material containing one or more of manganese, magnesium, zirconium, and/or beryllium may be used. Aluminum to which an element selected from titanium, tantalum, tungsten, molybdenum, chromium, neodymium, or scandium is added alone or in combination may be used. Further, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), or an indium oxide-zinc oxide alloy ($In_2O_3$—ZnO); or a conductive metal oxide obtained by adding silicon or silicon oxide to any of these metal oxide materials may be used.

The first conductive film 242 can be formed using a material and a method which are similar to those of the second conductive film 245. The thickness of the first conductive film 242 is 50 nm to 500 nm inclusive, for example. Note that the first conductive film 242 can have a single-layer structure or a stacked-layer structure including two or more layers. For example, the first conductive film 242 can have a single-layer structure of a titanium film, a single-layer structure of an aluminum film including silicon, a two-layer structure in which a titanium film is stacked over an aluminum film, or a three-layer structure in which a titanium film, an aluminum film, and a titanium film are stacked in this order.

Note that materials having etching selectivity are used for the first conductive film 242 and the second conductive film 245. Examples of a structure of the second conductive film 245 and the first conductive film 242 using a combination of materials which have etching selectivity include, a two-layer structure including a titanium film over a tungsten nitride film, a two-layer structure including a tungsten film over a titanium nitride film, a two-layer structure including a titanium film over a molybdenum nitride film, and a two-layer structure including a tungsten film over a tantalum nitride film.

As a material of the second conductive film 245, a metal material having a higher work function than the oxide semiconductor layer formed later is preferably used because the resistance at a contact interface with the oxide semiconductor layer can be increased. Examples of such metal materials include gold, platinum, tungsten nitride, and an indium oxide-tin oxide alloy. Further, it is preferable that a material having higher resistance than the first conductive film 242 be used for the second conductive film 245, because regions of the source electrode and the drain electrode of the transistor 260 which are contact with the channel formation region of the oxide semiconductor layer can have higher resistance than the other region, and thus an electric field between the source electrode and the drain electrode can be relaxed and a short-channel effect can be suppressed. Furthermore, since the second conductive film 245 serves as part of the source or drain electrode and is in contact with the oxide semiconductor layer, a material which does not cause a chemical reaction when being in contact with the oxide semiconductor layer is preferably used for the second conductive film 245.

In this embodiment, a molybdenum nitride film is formed as the second conductive film 245 and a titanium film is formed as the first conductive film 242.

The insulating film 243 is formed with a thickness of 50 nm to 300 nm inclusive, preferably 100 nm to 200 nm inclusive. In this embodiment, a silicon oxide film is formed as the insulating film 243. Note that the insulating film 243 is not necessarily formed but when the insulating film 243 is formed, a contact region (e.g., a contact area) between the source or drain electrode formed by later etching and the oxide semiconductor layer can be controlled easily. In other words, the resistance of the source or drain electrode can be easily controlled, and a short-channel effect can be efficiently suppressed. Further, by providing the insulating film 243, parasitic capacitance generated between the gate electrode to be formed later and the source and drain electrodes can be reduced.

Then, a mask is formed over the insulating film 243, and the insulating film 243 is etched using the mask to form the insulating layer 243a and the insulating layer 243b. The etching of the insulating film 243 can be either wet etching or dry etching, or wet etching and dry etching may be used in combination. The etching conditions (e.g., an etching gas or an etchant, etching time, and temperature) are set as appropriate depending on the material so that the insulating film 243 can be etched to have a desired shape. Note that, in order to process the channel length (L) of the transistor minutely, dry etching is preferably used. As an etching gas for the dry etching, a gas containing fluorine such as sulfur hexafluoride ($SF_6$), nitrogen trifluoride ($NF_3$), trifluoromethane ($CHF_3$), or octafluorocyclobutane ($C_4F_8$); a gas containing chlorine such as chlorine ($Cl_2$) or boron trichloride ($BCl_3$); a mixed gas of tetrafluoromethane ($CF_4$) and hydrogen; or the like can be used. A rare gas (a helium (He), argon (Ar), or xenon (Xe)), carbon monoxide, carbon dioxide, or the like may be added.

Figure 2A:
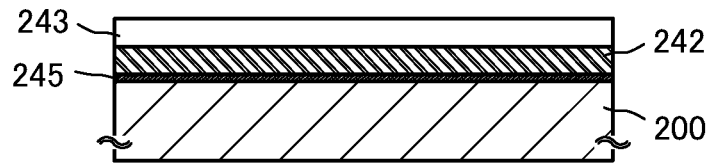
FIGS. 2A to 2E are cross-sectional views illustrating manufacturing steps of a semiconductor device.
Figure 2B:
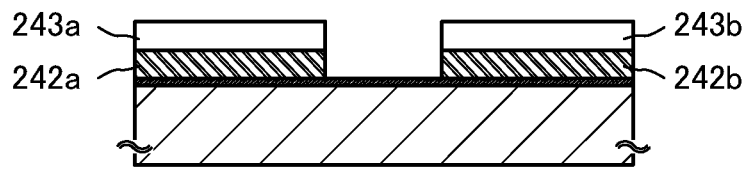
Figure 2C:
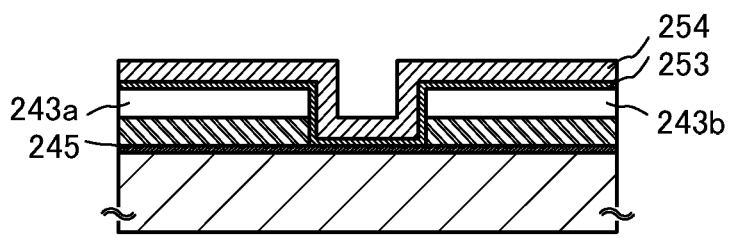

Then, the first conductive film 242 is etched using the mask used for the etching of the insulating film 243 to form the first conductive layer 242a and the first conductive layer 242b (see FIG. 2B). Note that in the etching of the first conductive film 242, an etching material (e.g., an etching gas and an etchant) which ensures etching selectivity with respect to the second conductive film 245 is used. Further, the mask may be removed before the first conductive film 242 is etched, and the first conductive film 242 may be etched using the insulating layer 243a and the insulating layer 243b as a mask.

The etching of the first conductive film 242 may be either wet etching or dry etching. Alternatively, wet etching and dry etching may be used in combination. The etching conditions (e.g., an etching gas or an etchant, etching time, and temperature) are set as appropriate depending on the material so that the first conductive film 242 can be etched to have a desired shape. Note that, in order to process the channel length (L) of the transistor minutely, dry etching is preferably used. In this embodiment, the first conductive film 242 is processed by dry etching using, as an etching gas, a mixed gas of boron trichloride ($BCl_3$) and chlorine ($Cl_2$); a mixed gas of tetrafluoromethane ($CF_4$), chlorine ($Cl_2$), and oxygen ($O_2$); a mixed gas of tetrafluoromethane ($CF_4$) and oxygen ($O_2$); a mixed gas of sulfur hexafluoride ($SF_6$), chlorine ($Cl_2$), and oxygen ($O_2$); or a mixed gas of sulfur hexafluoride ($SF_6$) and oxygen ($O_2$).

Then, an insulating film 253 is formed so as to cover the insulating layer 243a, the insulating layer 243b, and the exposed second conductive film 245. After that, an insulating film 254 is formed over the insulating film 253 (see FIG. 2C). The insulating film 253 and the insulating film 254 can be formed by a CVD method or a sputtering method. The insulating film 253 and the insulating film 254 can be formed using a nitride insulating layer including silicon nitride, silicon nitride oxide, aluminum nitride, or the like or an oxide insulating layer including silicon oxide, silicon oxynitride, aluminum oxide, or the like. Here, the insulating film 253 is preferably a nitride insulating layer and the insulating film 254 is preferably an oxide insulating layer.

Figure 2D:
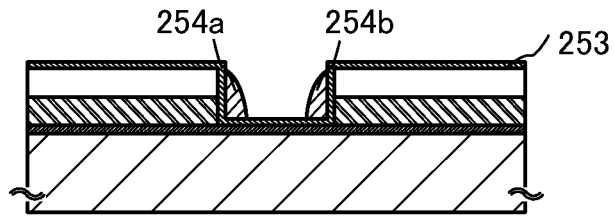

Then, the insulating film 254 is etched to form the insulating layer 254a and the insulating layer 254b (see FIG. 2D). The insulating layer 254a and the insulating layer 254b can be formed in a self-aligned manner by performing highly anisotropic etching treatment on the insulating film 254. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. Further, as the dry etching, a reactive ion etching method (an RIE method) in which a high-frequency voltage is applied to a substrate is preferably used.

For example, if a nitride insulating layer and an oxide insulating layer are used for the insulating film 253 and the insulating film 254, respectively, the insulating film 253 can serve as an etching stopper in the etching of the insulating film 254. With the insulating film 253 serving as an etching stopper, excessive etching of the second conductive film 245 can be suppressed. In addition, the use of the insulating film 253 facilitates detection of an endpoint of the etching of the insulating film 254. In addition, the length of the sidewall insulating layer 252a and the sidewall insulating layer 252b can be easily controlled.

Figure 2E:
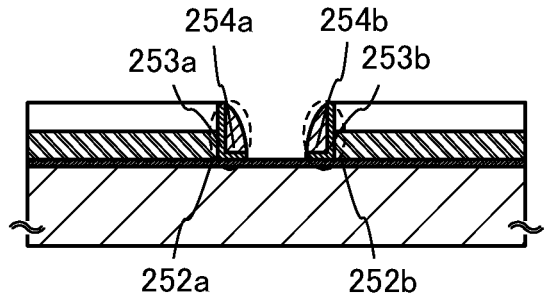

Then, the insulating film 253 is selectively etched using the insulating layer 254a and the insulating layer 254b as a mask, whereby the insulating layer 253a and the insulating layer 253b are formed (see FIG. 2E). Through the above steps, the sidewall insulating layer 252a including the insulating layer 253a and the insulating layer 254a and the sidewall insulating layer 252b including the insulating layer 253b and the insulating layer 254b can be formed in a region over the second conductive film 245 and between the first conductive layer 242a and the first conductive layer 242b.

Figure 3A:
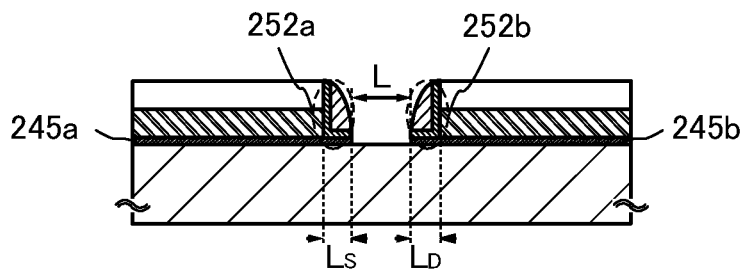
FIGS. 3A to 3D are cross-sectional views illustrating manufacturing steps of a semiconductor device.

Then, the second conductive film 245 is selectively etched using the sidewall insulating layer 252a and the sidewall insulating layer 252b as a mask, whereby the second conductive layer 245a and the second conductive layer 245b are formed (see FIG. 3A). Through this etching step, the source electrode in which the second conductive layer 245a and the first conductive layer 242a are stacked and the drain electrode in which the second conductive layer 245b and the first conductive layer 242b are stacked are formed.

The etching of the second conductive film 245 may be either wet etching or dry etching. Alternatively, wet etching and dry etching may be used in combination. The etching conditions (e.g., an etching gas or an etchant, etching time, and temperature) are set as appropriate depending on the material so that the second conductive film 245 can be etched to have a desired shape. Note that, in order to process the channel length (L) of the transistor minutely, dry etching is preferably used. When dry etching is employed for etching the second conductive film 245, as an etching gas, chlorine ($Cl_2$), boron trichloride ($BCl_3$), silicon tetrachloride ($SiCl_4$), tetrafluoromethane ($CF_4$), sulfur hexafluoride ($SF_6$), nitrogen trifluoride ($NF_3$), or the like, or a mixed gas of any of these in combination can be used. Further, a rare gas (helium (He), or argon (Ar)), oxygen, or the like may be added to the etching gas.

Note that if the sidewall insulating layer has a single-layer structure of an insulating layer, the second conductive film 245 may be unevenly etched in the formation of the sidewall insulating layer, which will hinder uniform etching of the second conductive film 245 in the formation of the second conductive layer 245a and the second conductive layer 245b and thus will cause variation in the thickness of the second conductive layer 245a and the second conductive layer 245b across the substrate plane. This will generate variation in the contact areas between the oxide semiconductor layer which is formed later and the second conductive layer 245a and the second conductive layer 245b, which may lead to variation in electrical characteristics of transistors across the substrate plane.

As is described in this embodiment, uneven etching of the second conductive film 245 in the formation of the sidewall insulating layers can be prevented by forming the sidewall insulating layer 252a and the sidewall insulating layer 252b in such a manner that after the insulating film 254 is etched to form the insulating layer 254a and the insulating layer 254b, the insulating film 253 is etched to form the insulating layer 253a and the insulating layer 253b. This allows uniform etching of the second conductive film 245 for the formation of the second conductive layer 245a and the second conductive layer 245b and thus the thickness or the like of the second conductive layer 245a and the second conductive layer 245b can be controlled across the substrate plane. This will reduce variation in the contact areas between the oxide semiconductor layer which is formed later and the second conductive layer 245a and the second conductive layer 245b, which may lead to less variation in electrical characteristics of transistors across the substrate plane.

The channel length (L) of the transistor 260 is determined by the distance between an end portion of the second conductive layer 245a and an end portion of the second conductive layer 245b. Although depending on the application of the transistor 260, the channel length (L) can be 10 nm to 1000 nm inclusive, preferably 20 nm to 400 nm inclusive, for example.

In the manufacturing process of the transistor described in this embodiment, since the second conductive film 245 is etched using the sidewall insulating layer 252a, the length ($L_S$) of the region of the second conductive layer 245a which extends beyond the end portion of the first conductive layer 242a in the channel length direction and which overlaps with part of the gate electrode 248 described below is substantially the same as the length of a bottom surface of the sidewall insulating layer 252a in the channel length direction. Similarly, since the second conductive film 245 is etched using the sidewall insulating layer 252b, the length ($L_D$) of the region of the second conductive layer 245b which extends beyond the end portion of the first conductive layer 242b in the channel length direction and which overlaps with part of the gate electrode 248 described below is substantially the same as the length of a bottom surface of the sidewall insulating layer 252b in the channel length direction. Since the sidewall insulating layer 252a and the sidewall insulating layer 252b are formed in a self-aligned manner by the etching treatment of the insulating film 254 and the insulating film 253, the length ($L_S$) and the length ($L_D$) are determined by the thickness of the insulating film 254 and the insulating film 253. That is, the channel length (L) of the transistor 260 can be adjusted minutely by controlling the thickness of the insulating film 254 and the insulating film 253. For example, the channel length (L) of the transistor 260 can be adjusted to be smaller than the minimum feature size of the light-exposure apparatus used for forming a mask. Therefore, the thickness of the insulating film 253 and the insulating film 254 may be determined depending on a desired channel length (L) of the transistor 260, the resolution of a light-exposure apparatus used for processing the first conductive layer 242a and the first conductive layer 242b, and the like.

Figure 3B:
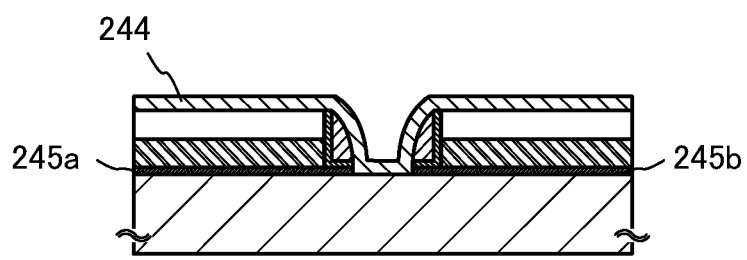

Then, the oxide semiconductor layer 244 is formed by a sputtering method so as to cover the insulating layer 243a, the insulating layer 243b, the sidewall insulating layer 252a, and the sidewall insulating layer 252b and be in contact with the second conductive layer 245a and the second conductive layer 245b (see FIG. 3B).

The source electrode of the transistor 260 is in contact with the oxide semiconductor layer 244 at the end portion of the second conductive layer 245a, specifically, at the end portion of the second conductive layer 245a of the region which extends beyond the end portion of the first conductive layer 242a in the channel length direction. Further, the drain electrode is in contact with the oxide semiconductor layer 244 at the end portion of the second conductive layer 245b, specifically, at the end portion of the second conductive layer 245b of the region which extends beyond the end portion of the first conductive layer 242b in the channel length direction.

Accordingly, when the end portion of the second conductive layer 245a and the second conductive layer 245b are in contact with the oxide semiconductor layer 244, the area where the source electrode and the drain electrode are in contact with the oxide semiconductor layer 244 can be significantly reduced as compared with the case where the top surfaces of the source electrode and the drain electrode are also in contact with the oxide semiconductor layer 244 or the case where the end portions of the first conductive layer 242a and the first conductive layer 242b are in contact with the oxide semiconductor layer 244. Therefore, the contact resistance at the contact interface can be increased. In addition, it is preferable to form the second conductive layer using a material having higher resistance than the first conductive layer, because the contact resistance can be increased more effectively.

The thickness of the source electrode in the region where the second conductive layer 245a extends beyond the end portion of the first conductive layer 242a in the channel length direction and overlaps with part of the gate electrode 248 described below (the region where the source electrode has a single layer of the second conductive layer) is smaller than that of the source electrode in the other region (the region where the source electrode has stacked layers of the first conductive layer and the second conductive layer). In other words, the area of a cross section which is perpendicular to the flow of electric charge is small. Since the resistance is inversely proportional to the area of the cross section, it can be said that the region of the second conductive layer 245a which extends beyond the end portion of the first conductive layer 242a in the channel length direction and overlaps with part of the gate electrode 248 described below has higher resistance than the other region; that is, the region is a high-resistance region (HRR). The same can also apply to the second conductive layer 245b.

In the transistor 260 described in this embodiment, the contact resistance between the source or drain electrode and the oxide semiconductor layer 244 is increased, and the vicinity of the region in the source or drain electrode which is in contact with the channel formation region of the oxide semiconductor layer 244 is a high-resistance region; therefore, even when the channel length (L) of the transistor 260 is reduced, the electric field between the source electrode and the drain electrode is relaxed and a short-channel effect can be suppressed.

In addition, because the sidewall insulating layer 252a and the sidewall insulating layer 252b are formed in such a manner that after the insulating film 254 is etched to form the insulating layer 254a and the insulating layer 254b, the insulating film 253 is etched to form the insulating layer 253a and the insulating layer 253b, variation in etching for forming the second conductive layer 245a and the second conductive layer 245b across the substrate plane can be reduced compared to the case where the sidewall insulating layer is formed using a single insulating layer. Thus, across the substrate plane, variation in the contact areas between the oxide semiconductor layer 244 and the second conductive layer 245a and the second conductive layer 245b can be reduced, which may lead to less variation in electrical characteristics of transistors.

Moreover, by providing the sidewall insulating layer 252a and the sidewall insulating layer 252b, coverage with the oxide semiconductor layer 244 and the gate insulating layer 246 can be improved, and occurrence of connection failure and the like can be suppressed.

The oxide semiconductor layer 244 can be formed using a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; a single-component metal oxide such as an In—O-based metal oxide, a Sn—O-based metal oxide, a Zn—O-based metal oxide; or the like.

In particular, an In—Ga—Zn—O-based oxide semiconductor material has sufficiently high resistance when there is no electric field and thus off-state current can be sufficiently reduced. In addition, the In—Ga—Zn—O-based oxide semiconductor material has high field-effect mobility and thus is suitable as a semiconductor material used for a semiconductor device.

As a typical example of the In—Ga—Zn—O-based oxide semiconductor material, the one represented by InGaO$_3$(ZnO)$_m$ (m>0) is given. In addition, an oxide semiconductor material in which Ga is replaced by M and which is represented by InMO$_3$(ZnO)$_m$ (m>0) can also be given. Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above compositions are merely examples given in accordance with a crystal structure.

When an In—Zn—O-based material is used as an oxide semiconductor, a target to be used has a composition ratio expressed by the equation In:Zn=50:1 to 1:2 in atomic ratio (In$_2$O$_3$:ZnO=25:1 to 1:4 in molar ratio), preferably In:Zn=20:1 to 1:1 in atomic ratio (In$_2$O$_3$:ZnO=10:1 to 1:2 in molar ratio), more preferably In:Zn=15:1 to 1.5:1 in atomic ratio (In$_2$O$_3$:ZnO=15:2 to 3:4 to in molar ratio). For example, the target used for deposition of an In—Zn—O-based oxide semiconductor has a composition ratio expressed by the equation Z>1.5X+Y when In:Zn:O=X:Y:Z in atomic ratio.

As a target used for forming the oxide semiconductor layer 244 by a sputtering method, a target which has a composition ratio expressed by the equation In:Ga:Zn=1:x:y (x is 0 or more and y is 0.5 to 5 inclusive) is preferable. For example, a target for oxide semiconductor deposition which has a composition ratio expressed by the equation In$_2$O$_3$:Ga$_2$O$_3$:ZnO=1:1:2 [molar ratio] (x=1, y=1) or the like can be used. Alternatively, a target for oxide semiconductor deposition which has a composition ratio expressed by the equation In$_2$O$_3$:Ga$_2$O$_3$:ZnO=1:1:1 [molar ratio] (x=1, y=0.5), a composition ratio expressed by the equation In$_2$O$_3$:Ga$_2$O$_3$:ZnO=1:1:4 [molar ratio] (x=1, y=2), or a composition ratio expressed by the equation In$_2$O$_3$:Ga$_2$O$_3$:ZnO=1:0:2 [molar ratio] (x=0, y=1) can be used.

In this embodiment, the oxide semiconductor layer 244 having an amorphous structure is formed by a sputtering method using an In—Ga—Zn—O-based target for oxide semiconductor deposition.

The relative density of metal oxide in the target for oxide semiconductor deposition is 80% or higher, preferably 95% or higher, more preferably 99.9% or higher. With the use of the target for oxide semiconductor deposition with high relative density, the oxide semiconductor layer 244 having a dense structure can be formed.

The atmosphere in which the oxide semiconductor layer 244 is formed is preferably a rare gas (typically argon) atmosphere, an oxygen atmosphere, or a mixed atmosphere including a rare gas (typically argon) and oxygen. Specifically, it is preferable to use, for example, a high-purity gas atmosphere from which impurities such as hydrogen, water, hydroxyl, or hydride are removed so that the concentration thereof is reduced to 1 ppm or less (preferably to 10 ppb or less).

In the formation of the oxide semiconductor layer 244, for example, an object to be processed (here, a structure body including the substrate 200) is held in a process chamber that is kept under reduced pressure and the object is heated to a temperature higher than or equal to 100° C. and lower than 550° C., preferably 200° C. to 400° C. inclusive. Alternatively, the temperature of the object in the formation of the oxide semiconductor layer 244 may be room temperature. While moisture in the process chamber is removed, a sputtering gas from which hydrogen, water, and the like are removed is introduced, and the above target is used, and thus the oxide semiconductor layer 244 is formed. The oxide semiconductor layer 244 is formed while the object is heated, whereby impurities in the oxide semiconductor layer 244 can be reduced. In addition, damage of the oxide semiconductor layer 244 due to sputtering can be reduced. In order to remove moisture in the process chamber, an entrapment vacuum pump is preferably used. For example, a cryopump, an ion pump, or a titanium sublimation pump can be used. Further, a turbo pump provided with a cold trap may be used. By evacuation with a cryopump or the like, hydrogen, water, and the like can be removed from the process chamber, whereby the impurity concentration of the oxide semiconductor layer 244 can be reduced.

The oxide semiconductor layer 244 can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferable because powdery substances (also referred to as particles or dust) formed at the time of film formation can be reduced and the film thickness variation can be small. The thickness of the oxide semiconductor layer 244 is, for example, 3 nm to 30 nm inclusive, preferably 5 nm to 15 nm inclusive. The use of the oxide semiconductor layer 244 of such a thickness makes it possible to suppress a short-channel effect which is caused by miniaturization. Note that the appropriate thickness of the oxide semiconductor layer 244 differs depending on the oxide semiconductor material to be used, the application of the semiconductor device, or the like; therefore, the thickness can also be determined in accordance with the material, the application, or the like.

Note that before the oxide semiconductor layer 244 is formed by a sputtering method, reverse sputtering in which plasma is generated with an argon gas introduced is preferably performed, so that substances attached to a surface on which the oxide semiconductor layer is to be formed (e.g., a surface of the insulating layer 243a and the insulating layer 243b) are removed. Here, the reverse sputtering refers to a method in which ions collide with a surface of the substrate to be processed in order to modify the surface, in contrast to normal sputtering in which ions collide with a sputtering target. An example of a method for making ions collide with a surface to be processed is a method in which a high-frequency voltage is applied to the surface in an argon atmosphere so that plasma is generated near the object. Note that the atmosphere may be a nitrogen atmosphere, a helium atmosphere, an oxygen atmosphere, or the like instead of an argon atmosphere.

After that, heat treatment (first heat treatment) is preferably performed on the oxide semiconductor layer 244. By the first heat treatment, excessive hydrogen (including water and hydroxyl) in the oxide semiconductor layer 244 can be removed, the structure of the oxide semiconductor layer can be improved, and defect states in the energy gap can be reduced. The temperature of the first heat treatment is, for example, higher than or equal to 300° C. and lower than 550° C., or 400° C. to 500° C. inclusive.

The heat treatment can be performed in such a manner that, for example, the object is introduced into an electric furnace provided with a resistance heating element or the like and heated at 450° C. for one hour in a nitrogen atmosphere. During the heat treatment, the oxide semiconductor layer 244 is not exposed to air to prevent entry of water and hydrogen.

The heat treatment apparatus is not limited to an electric furnace and may be an apparatus for heating an object by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

For example, as the first heat treatment, GRTA treatment may be performed in which the object is put in a heated inert gas atmosphere and heated for several minutes, and then taken out of the inert gas atmosphere. GRTA treatment enables high-temperature heat treatment for a short time. Moreover, GRTA treatment enables treatment at a temperature which exceeds the upper temperature limit of the object. Note that the inert gas may be changed to a gas including oxygen during the treatment. This is because defect states in the energy gap due to oxygen deficiencies can be reduced by performing the first heat treatment in an atmosphere including oxygen.

Note that as the inert gas atmosphere, an atmosphere that includes nitrogen or a rare gas (such as helium, neon, or argon) as a main component and does not include water, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the concentration of an impurity is lower than or equal to 1 ppm, preferably lower than or equal to 0.1 ppm).

In any case, impurities are reduced by the first heat treatment so that the i-type (intrinsic) or substantially i-type oxide semiconductor layer 244 is obtained. Accordingly, a transistor having significantly excellent characteristics can be realized.

The above heat treatment (the first heat treatment) has an effect of removing hydrogen, water, and the like and thus can be referred to as dehydration treatment, dehydrogenation treatment, or the like. The dehydration treatment or the dehydrogenation treatment can also be performed at the following timing: after the formation of the oxide semiconductor layer, after the formation of the gate insulating layer, after the formation of the gate electrode, or the like. Such dehydration treatment or dehydrogenation treatment may be performed once or more times.

Figure 3C:
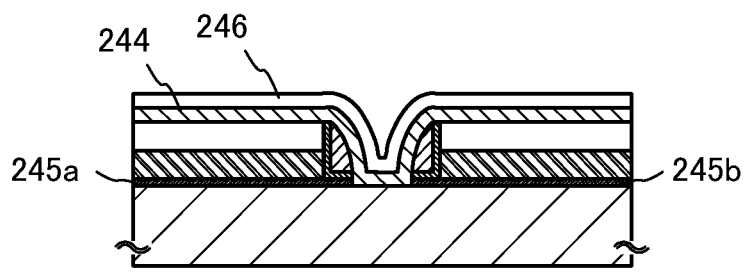

Then, the gate insulating layer 246 in contact with the oxide semiconductor layer 244 is formed (see FIG. 3C). Here, the sidewall insulating layer 252a and the sidewall insulating layer 252b are formed over the second conductive layer 245a and the second conductive layer 245b, respectively, whereby the end portions of the source and drain electrodes can have gradual steps. Therefore, coverage with the gate insulating layer 246 can be improved, and breakage due to steps can be prevented.

The gate insulating layer 246 can be formed by a CVD method, a sputtering method, or the like. The gate insulating layer 246 preferably includes silicon oxide, silicon nitride, silicon oxynitride, silicon nitride oxide, aluminum oxide, tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 246 may have a single-layer structure or a stacked-layer structure. There is no particular limitation on the thickness of the gate insulating layer 246; in the case where the semiconductor device is miniaturized, the gate insulating layer 246 is preferably thin in order to ensure the operation of the transistor. For example, in the case of using silicon oxide, the thickness can be 1 nm to 100 nm inclusive, preferably 10 nm to and 50 nm inclusive.

When the gate insulating layer is thin as in the above description, a problem of gate leakage due to a tunneling effect or the like is caused. In order to solve the problem of gate leakage, it is preferable that the gate insulating layer 246 be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 246, electrical characteristics can be ensured and the thickness of the gate insulating layer 246 can be large to prevent gate leakage. Note that a stacked-layer structure of a film including a high-k material and a film including any of silicon oxide, silicon nitride, silicon oxynitride, silicon nitride oxide, aluminum oxide, and the like may be employed.

After the gate insulating layer 246 is formed, second heat treatment is preferably performed in an inert gas atmosphere or an oxygen atmosphere. The temperature of the heat treatment is 200° C. to 450° C. inclusive, preferably 250° C. to 350° C. inclusive. For example, the heat treatment may be performed at 250° C. for one hour in a nitrogen atmosphere. The second heat treatment can reduce variation in electric characteristics of the transistors. In addition, in the case where the gate insulating layer 246 includes oxygen, oxygen can be supplied to the oxide semiconductor layer 244 to fill oxygen deficiencies in the oxide semiconductor layer 244, whereby an i-type (intrinsic) or substantially i-type oxide semiconductor layer can be formed.

Note that the second heat treatment is performed after the gate insulating layer 246 is formed in this embodiment; however, the timing of the second heat treatment is not particularly limited to this. For example, the second heat treatment may be performed after the gate electrode is formed. Alternatively, the first heat treatment and the second heat treatment may be successively performed, the first heat treatment may double as the second heat treatment, or the second heat treatment may double as the first heat treatment.

As described above, at least one of the first heat treatment and the second heat treatment is employed, whereby impurities which are not the main components of the oxide semiconductor are excluded as much as possible and the oxide semiconductor layer 244 can be highly purified. Thus, the concentration of hydrogen in the oxide semiconductor layer 244 can be lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. In addition, the carrier density of the oxide semiconductor layer 244 can be sufficiently low (e.g., lower than $1 \times 10^{12}$/cm$^3$, preferably lower than $1.45 \times 10^{10}$/cm$^3$) as compared to the carrier density of a general silicon wafer (approximately $1 \times 10^{14}$/cm$^3$). Thus, the off-state current is sufficiently low. For example, the off-state current (here, current per micrometer (μm) of channel width) of the transistor 260 at room temperature is smaller than or equal to 100 zA (1 zA (zepto-ampere) is $1 \times 10^{-21}$ A), preferably smaller than or equal to 10 zA.

Figure 3D:
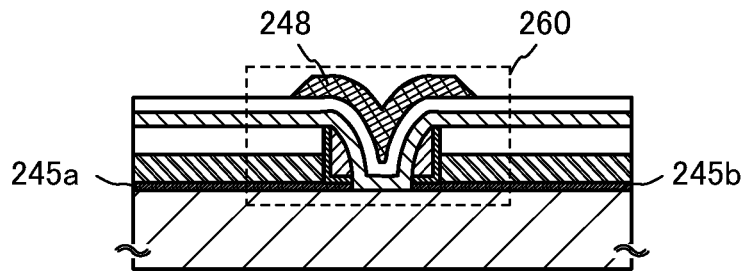

Then, the gate electrode 248 is formed over the gate insulating layer 246 in a region overlapping with the channel formation region of the oxide semiconductor layer 244 (see FIG. 3D). The gate electrode 248 can be formed by forming a conductive film over the gate insulating layer 246 and then selectively etching the conductive film. The conductive film to be the gate electrode 248 can be formed by a PVD method such as a sputtering method or a CVD method such as a plasma CVD method. The details are similar to those of the source or drain electrode or the like; thus, the description thereof can be referred to. Note that if the work function of a material of the gate electrode 248 is substantially the same or smaller than the electron affinity of the oxide semiconductor layer 244, the threshold voltage may shift in the negative direction in the case where a transistor is miniaturized. Therefore, as a material of the gate electrode 248, a material with a work function that is higher than the electron affinity of the oxide semiconductor layer 244 is preferably used. As such a material, tungsten, platinum, gold, silicon having p-type conductivity, and the like can be given, for example.

Through the above steps, the transistor 260 including the oxide semiconductor layer 244 is completed.

The channel length (L) of the transistor 260 in this embodiment can be controlled minutely by the thickness of the insulating film 254 and the insulating film 253 for forming the sidewall insulating layer 252a and the sidewall insulating layer 252b. Accordingly, by setting the thickness of the insulating film 254 and the insulating film 253 as appropriate, the channel length (L) of the transistor 260 is reduced and the semiconductor device can be easily miniaturized.

In the transistor 260 in this embodiment, the sidewall insulating layer 252a is formed in the region where the second conductive layer 245a extends beyond the end portion of the first conductive layer 242a in the channel length direction and overlaps with part of the gate electrode 248 and the sidewall insulating layer 252b is formed in the region where the second conductive layer 245b extends beyond the end portion of the first conductive layer 242b in the channel length direction and overlaps with part of the gate electrode 248. Thus, coverage with the oxide semiconductor layer 244 and the gate insulating layer 246 can be improved, and occurrence of connection failure and the like can be suppressed.

In the transistor 260 in this embodiment, the second conductive layer 245a has a region which extends beyond the end portion of the first conductive layer 242a in the channel length direction and which overlaps with part of the gate electrode 248 and the second conductive layer 245b has a region which extends beyond the end portion of the first conductive layer 242b in the channel length direction and which overlaps with part of the gate electrode 248, and the vicinity of the region in the source and drain electrodes which is in contact with the channel formation region of the oxide semiconductor layer 244 is made to be a high-resistance region. Accordingly, the electric field between the source electrode and the drain electrode is relaxed and a short-channel effect such as a decrease in threshold voltage can be suppressed.

In addition, because the sidewall insulating layer 252a and the sidewall insulating layer 252b are formed in such a manner that after the insulating film 254 is etched to form the insulating layer 254a and the insulating layer 254b, the insulating film 253 is etched to form the insulating layer 253a and the insulating layer 253b, variation in etching for forming the second conductive layer 245a and the second conductive layer 245b across the substrate plane can be reduced compared to the case where the sidewall insulating layer is formed using a single insulating layer. Thus, across the substrate plane, variation in the contact areas between the oxide semiconductor layer 244 and the second conductive layer 245a and the second conductive layer 245b can be reduced, which may lead to less variation in electrical characteristics of transistors.

As described above, according to one embodiment of the disclosed invention, the problems which are caused due to miniaturization can be solved. As a result, it is possible to sufficiently reduce the size of a transistor. By sufficiently reducing the size of a transistor, the area occupied by a semiconductor device is reduced and the number of semiconductor devices which can be manufactured using one substrate is increased. Accordingly, the manufacturing cost per semiconductor device is suppressed. Further, the size of the semiconductor device can be reduced without its function degrading; therefore, the semiconductor device of the same size can have improved functions. Moreover, advantageous effects such as high-speed operation and low power consumption due to a reduction in channel length can be obtained. In other words, according to one embodiment of the disclosed invention, miniaturization of a transistor including an oxide semiconductor is achieved, and a variety of advantageous effects accompanying it can be obtained.

MODIFICATION EXAMPLE

Next, modified examples of the semiconductor device illustrated in FIG. 1 will be described with reference to FIGS. 4A to 4C.

Figure 4A:
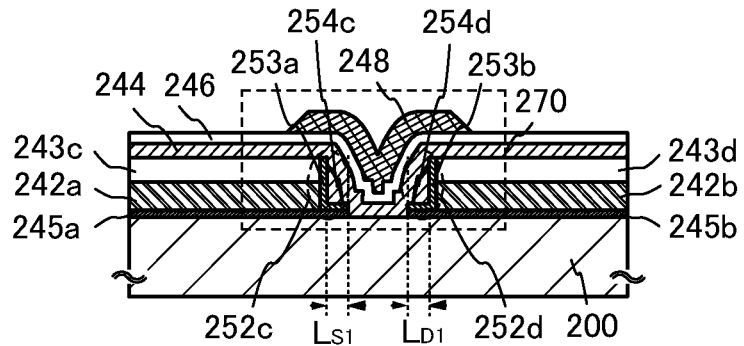
FIGS. 4A to 4C are cross-sectional views of a semiconductor device.

A transistor 270 illustrated in FIG. 4A has a structure partly different from the structure of the transistor 260 illustrated in FIG. 1.

The transistor 270 illustrated in FIG. 4A has a sidewall insulating layer 252c and a sidewall insulating layer 252d. The sidewall insulating layer 252c includes an insulating layer 254c the length of a bottom surface of which in the channel length direction is shorter than the length ($L_{S1}$) of an extended region of the insulating layer 253a. The sidewall insulating layer 252d includes an insulating layer 254d the length of a bottom surface of which in the channel length direction is shorter than the length ($L_{D1}$) of an extended region of the insulating layer 253b.

A manufacturing method of the transistor 270 illustrated in FIG. 4A is described. After the steps illustrated in FIGS. 2A to 2E and FIG. 3A are performed, the insulating layer 254a and the insulating layer 254b recede (are decreased in size) by etching, whereby the insulating layer 253a and the insulating layer 253b are partly exposed. Etching with high anisotropy is preferably employed for the etching of the insulating layer 254a and the insulating layer 254b, but etching with low anisotropy does not pose a serious problem. The etching may be performed in a condition where at least the insulating layer 254c and the insulating layer 254d are formed and the etching selectively is provided with respect to the second conductive layer 245a and the second conductive layer 245b. In the case of the etching with high anisotropy, for example, etching may be performed in a manner similar to that of the etching for forming the insulating layer 254a and the insulating layer 254b. Note that the insulating layer 243a and the insulating layer 243b are also etched in this etching to be an insulating layer 243c and an insulating layer 243d having a reduced thickness. After the formation of the insulating layer 254c and the insulating layer 254d, the steps illustrated in FIGS. 3B to 3D may be performed.

The insulating layer 254a and the insulating layer 254b recede by etching to form the insulating layer 254c and the insulating layer 254d and the sidewall insulating layer 252c and the sidewall insulating layer 252d are formed, whereby the coverage with the oxide semiconductor layer 244 is improved and occurrence of connection failure or the like can be suppressed.

Figure 4B:
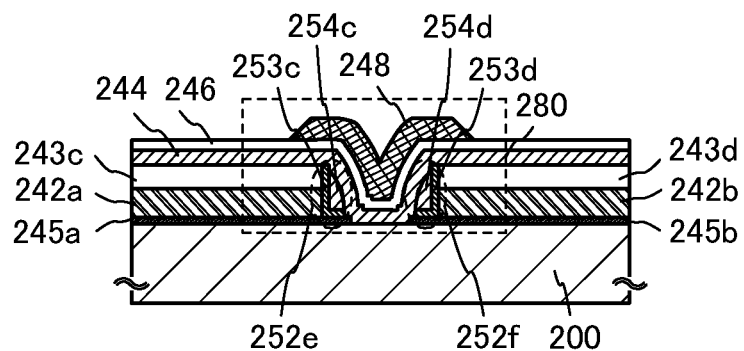

A transistor 280 illustrated in FIG. 4B has a structure partly different from the structure of the transistor 270 illustrated in FIG. 4A.

The source electrode of the transistor 280 illustrated in FIG. 4B is in contact with the oxide semiconductor layer 244 at the end portion of the second conductive layer 245a, specifically, at the end portion of the second conductive layer 245a of the region which extends beyond the end portion of the first conductive layer 242a in the channel length direction and which overlaps with part of the gate electrode 248 and also at part of a top surface of the second conductive layer 245a which is not in contact with the first conductive layer 242a or a sidewall insulating layer 252e. The drain electrode is in contact with the oxide semiconductor layer 244 at the end portion of the second conductive layer 245b, specifically, at the end portion of the second conductive layer 245b of the region which extends beyond the end portion of the first conductive layer 242b in the channel length direction and which overlaps with part of the gate electrode 248 and also at part of a top surface of the second conductive layer 245b which is not in contact with the first conductive layer 242b or a sidewall insulating layer 252f.

A manufacturing method of the transistor 280 illustrated in FIG. 4B is described. After the insulating layer 254c and the insulating layer 254d are formed according to the manufacturing method of the transistor 270 illustrated in FIG. 4A, the insulating layer 253a and the insulating layer 253b recede by etching, whereby the second conductive layer 245a and the second conductive layer 245b are partly exposed. Etching with high anisotropy is preferably employed for the etching of the insulating layer 253a and the insulating layer 253b, but etching with low anisotropy does not pose a serious problem. The etching may be performed in a condition where at least the insulating layer 253c and the insulating layer 253d are formed and the etching selectively is provided with respect to the second conductive layer 245a and the second conductive layer 245b. In the case of the etching with high anisotropy, for example, etching may be performed in a manner similar to that of the etching for forming the insulating layer 253a and the insulating layer 253b. After the formation of the insulating layer 253c and the insulating layer 253d, the steps illustrated in FIGS. 3B to 3D may be performed.

The insulating layer 253a, the insulating layer 253b, the insulating layer 254a, and the insulating layer 254b recede by etching to form the insulating layer 253c, the insulating layer 253d, the insulating layer 254c, and the insulating layer 254d, and thus the sidewall insulating layer 252e and the sidewall insulating layer 252f are formed, whereby regions of top surfaces of the second conductive layer 245a and the second conductive layer 245b can be in contact with the oxide semiconductor layer 244. Thus, contact failure between the oxide semiconductor layer 244 and the source or drain electrode can be suppressed.

Figure 4C:
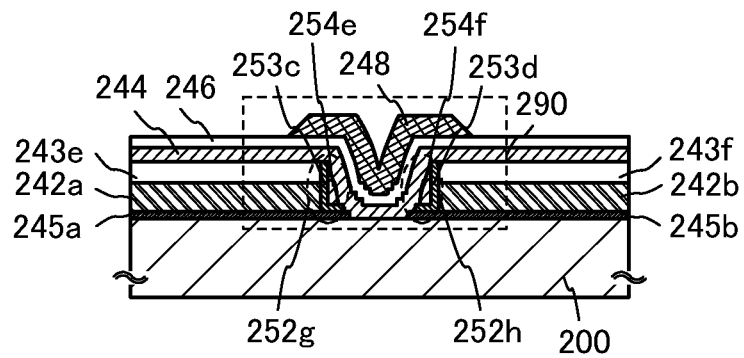

A transistor 290 illustrated in FIG. 4C has a structure partly different from the structure of the transistor 280 illustrated in FIG. 4B.

The source electrode of the transistor 290 illustrated in FIG. 4C is in contact with the oxide semiconductor layer 244 at the end portion of the second conductive layer 245a, specifically, at the end portion of the second conductive layer 245a of the region which extends beyond the end portion of the first conductive layer 242a in the channel length direction and which overlaps with part of the gate electrode 248 and also at part of a top surface of the second conductive layer 245a which is not in contact with the first conductive layer 242a or a sidewall insulating layer 252g. The drain electrode is in contact with the oxide semiconductor layer 244 at the end portion of the second conductive layer 245b, specifically, at the end portion of the second conductive layer 245b of the region which extends beyond the end portion of the first conductive layer 242b in the channel length direction and which overlaps with part of the gate electrode 248 and also at part of a top surface of the second conductive layer 245b which is not in contact with the first conductive layer 242b or a sidewall insulating layer 252h.

A manufacturing method of the transistor 290 illustrated in FIG. 4C is described. After the insulating layer 253c and the insulating layer 253d are formed according to the manufacturing method of the transistor 280 illustrated in FIG. 4B, the insulating layer 254c and the insulating layer 254d recede by etching, whereby the insulating layer 253c and the insulating layer 253d are partly exposed. Etching with high anisotropy is preferably employed for the etching of the insulating layer 254c and the insulating layer 254d, but etching with low anisotropy does not pose a serious problem. The etching may be performed in a condition where at least the insulating layer 254e and the insulating layer 254f are formed and the etching selectively is provided with respect to the second conductive layer 245a and the second conductive layer 245b. In the case of the etching with high anisotropy, for example, etching may be performed in a manner similar to that of the etching for forming the insulating layer 254a and the insulating layer 254b. Note that the insulating layer 243c and the insulating layer 243d are also etched in this etching to be an insulating layer 243e and an insulating layer 243f having a reduced thickness. After the formation of the insulating layer 254e and the insulating layer 254f, the steps illustrated in FIGS. 3B to 3D may be performed.

The insulating layer 254c and the insulating layer 254d recede by etching to form the insulating layer 254e and the insulating layer 254f, and thus the sidewall insulating layer 252g and the sidewall insulating layer 252h are formed, whereby regions of top surfaces of the second conductive layer 245a and the second conductive layer 245b can be in contact with the oxide semiconductor layer 244. Thus, contact failure between the oxide semiconductor layer 244 and the source or drain electrode can be suppressed.

The structures, methods, and the like described in this embodiment can be combined as appropriate with any of the structures and methods described in the other embodiments.

Embodiment 2

In this embodiment, application examples of a semiconductor device according to one embodiment of the disclosed invention will be described with reference to FIGS. 5A to 5C. Here, an example of a memory device will be described. Note that in each of the circuit diagrams, "OS" may be written beside a transistor in order to indicate that the transistor includes an oxide semiconductor.

Figure 5A:
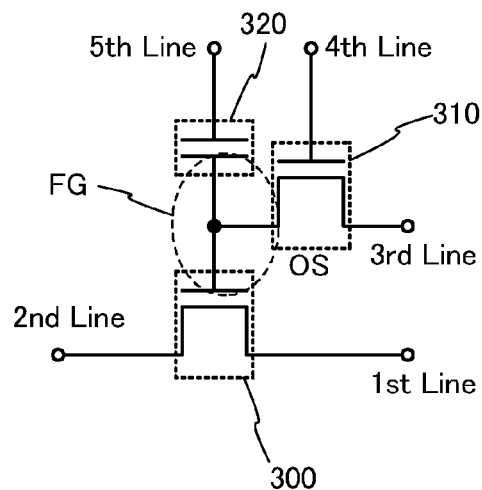
FIGS. 5A to 5C are examples of a circuit diagram of a semiconductor device.

In the semiconductor device in FIG. 5A, a first wiring (a 1st line) and a source electrode of a transistor 300 are electrically connected to each other, and a second wiring (a 2nd line) and a drain electrode of the transistor 300 are electrically connected to each other. In addition, a gate electrode of the transistor 300 and one of a source electrode and a drain electrode of a transistor 310 are electrically connected to one electrode of a capacitor 320, a third wiring (a 3rd line) and the other of the source electrode and the drain electrode of the transistor 310 are electrically connected to each other, and a fourth wiring (a 4th line) and a gate electrode of the transistor 310 are electrically connected to each other. In addition, a fifth wiring (a 5th line) and the other electrode of the capacitor 320 are electrically connected to each other.

Here, a transistor including the oxide semiconductor described above is used as the transistor 310. Off-state current of a transistor including an oxide semiconductor is extremely small. Therefore, when the transistor 310 is in an off state, a potential in the gate electrode of the transistor 300 can be held for a very long time. In addition, the capacitor 320 facilitates holding of charge supplied to the gate electrode of the transistor 300 and reading of the held data.

Note that there is no particular limitation on the transistor 300. In order to increase the speed of reading data, it is preferable to use, for example, a transistor with high switching speed, such as a transistor formed using single crystal silicon.

Figure 5C:
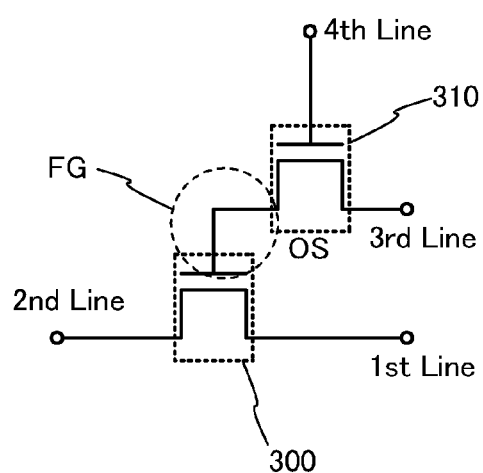

Alternatively, the capacitor 320 may be omitted as in FIG. 5C.

The semiconductor device in FIG. 5A can write, hold, and read data as described below, utilizing a characteristic in which the potential of the gate electrode of the transistor 300 can be held.

Firstly, writing and holding of data will be described. The potential of the fourth wiring is set to a potential at which the transistor 310 is turned on, whereby the transistor 310 is turned on. Thus, the potential of the third wiring is applied to the gate electrode of the transistor 300 and the capacitor 320. That is, predetermined charge is supplied to the gate electrode of the transistor 300 (writing of data). Here, charge for applying either two different levels of potential (hereinafter, charge for applying a low potential is referred to as charge $Q_L$ and charge for applying a high potential is referred to as charge $Q_H$) is supplied. Note that charge for applying three or more different levels of potential may be employed to improve storage capacity. After that, the potential of the fourth wiring is set to a potential at which the transistor 310 is turned off, whereby the transistor 310 is turned off. Thus, the charge supplied to the gate electrode of the transistor 300 is held (holding of data).

Since the off-state current of the transistor 310 is extremely small, the charge in the gate electrode of the transistor 300 is held for a long period.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 300. This is because in general, when the transistor 300 is an n-channel transistor, an apparent threshold value $V_{th\_H}$ in the case where $Q_H$ is supplied to the gate electrode of the transistor 300 is lower than an apparent threshold value $V_{th\_L}$ in the case where $Q_L$ is supplied to the gate electrode of the transistor 300. Here, an apparent threshold value refers to the potential of the fifth wiring which is needed to turn on the transistor 300. Thus, by setting the potential of the fifth wiring to a potential $V_0$ which is between $V_{th\_H}$ and $V_{th\_L}$, charge supplied to the gate electrode of the transistor 300 can be determined For example, in the case where $Q_H$ is supplied in writing, when the potential of the fifth wiring is set to $V_0$ ($>V_{th\_H}$), the transistor 300 is turned on. In the case where $Q_L$ is supplied in writing, even when the potential of the fifth wiring is set to $V_0$ ($<V_{th\_L}$, the transistor 300 remains off. Thus, the held data can be read by measuring the potential of the second wiring.

Note that in the case where memory cells are arrayed, it is necessary to read out data only from a predetermined memory cell. In order that data of the predetermined memory cell may be read out and data of the other memory cells may not be read out, in the case where the transistors 300 of the memory cells are connected in parallel, a potential at which the transistor 300 is in an off state regardless of the state of the gate electrode, that is, a potential lower than $V_{th\_H}$, may be applied to the fifth wirings of the memory cells whose data is not to be read. In the case where the transistors 300 of the memory cells are connected in series, a potential at which the transistor 300 is in an on state regardless of the state of the gate electrode, that is, a potential higher than $V_{th\_L}$, may be applied to the fifth wirings of the memory cells whose data is not to be read.

Thirdly, rewriting of data will be described. Rewriting of data is performed in a manner similar to that of writing and holding of data. In other words, the potential of the fourth wiring is set to a potential at which the transistor 310 is turned on, whereby the transistor 310 is turned on. Accordingly, the potential of the third wiring (a potential for new data) is applied to the gate electrode of the transistor 300 and the capacitor 320. After that, the potential of the fourth wiring is set to a potential at which the transistor 310 is turned off, whereby the transistor 310 is turned off. Thus, charge for the new data is supplied to the gate electrode of the transistor 300.

In the semiconductor device according to the disclosed invention, data can be directly rewritten by another writing of data as described above. Therefore, extraction of charge from a floating gate with the use of high voltage, which is needed in a flash memory or the like, is not needed and thus a reduction in operation speed caused by erasing operation can be suppressed. In other words, high-speed operation of the semiconductor device can be realized.

Note that the source electrode or the drain electrode of the transistor 310 is electrically connected to the gate electrode of the transistor 300, and thereby has an effect similar to that of a floating gate of a floating-gate transistor which is used as a non-volatile memory element. The portion where the source electrode or the drain electrode of the transistor 310 and the gate electrode of the transistor 300 are electrically connected to each other is therefore called a floating gate portion FG in some cases. When the transistor 310 is off, the floating gate portion FG can be regarded as being embedded in an insulator and charge is held in the floating gate portion FG The off-state current of the transistor 310 including an oxide semiconductor is smaller than or equal to one hundred thousandth of the off-state current of a transistor including a silicon semiconductor or the like; thus, loss of the charge accumulated in the floating gate portion FG due to leakage current of the transistor 310 is negligible. That is, with the transistor 310 including an oxide semiconductor, a non-volatile memory device which can hold data without power supply can be realized.

For example, when the off-state current of the transistor 310 is smaller than or equal to 10 zA (1 zA (zeptoampere) is $1\times10^{-21}$ A) at room temperature and the capacitance value of the capacitor 320 is approximately 10 fF, data can be held for $10^4$ seconds or longer. It should be appreciated that the holding time changes depending on the transistor characteristics and the capacitance value.

Further, in this case, a problem of deterioration of a gate insulating film (a tunnel insulating film), which occurs in a conventional floating-gate transistor, does not exist. That is, deterioration of a gate insulating film due to injection of electrons into a floating gate, which has been regarded as a problem, can be solved. This means that there is no limit on the number of times of writing in principle. In addition, high voltage which is needed for writing or erasing data in a conventional floating-gate transistor is not necessary.

Figure 5B:
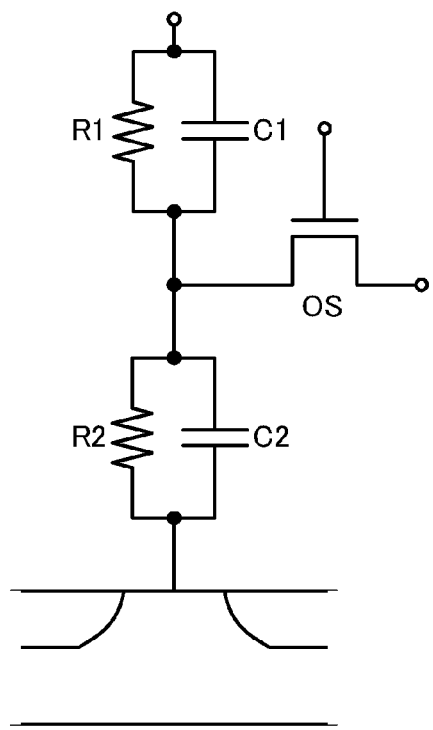

The components such as transistors in the semiconductor device in FIG. 5A can be regarded as including a resistor and a capacitor as shown in FIG. 5B. That is, in FIG. 5B, the transistor 300 and the capacitor 320 are each regarded as including a resistor and a capacitor. R1 and C1 denote the resistance value and the capacitance value of the capacitor 320, respectively. The resistance value R1 corresponds to the resistance value of an insulating layer included in the capacitor 320. R2 and C2 denote the resistance value and the capacitance value of the transistor 300, respectively. The resistance value R2 corresponds to the resistance value of a gate insulating layer at the time when the transistor 300 is on. The capacitance value C2 corresponds to the capacitance value of so-called gate capacitance (capacitance between the gate electrode and the source electrode or the drain electrode and capacitance between the gate electrode and the channel formation region).

A charge holding period (also referred to as a data holding period) is determined mainly by the off-state current of the transistor 310 under the condition where gate leakage current of the transistor 310 is sufficiently small, R1≥ROS and R2≥ROS where ROS is the resistance value (also referred to as effective resistance) between the source electrode and the drain electrode at the time when the transistor 310 is off.

When the condition is not satisfied, it would be difficult to ensure a sufficient holding period even if the off-state current of the transistor 310 is small enough. This is because leakage current other than the off-state current of the transistor 310 (e.g., leakage current generated between the source electrode and the gate electrode of the transistor 300) would be large. Thus, it can be said that the semiconductor device disclosed in this embodiment desirably satisfies the above relation.

It is desirable that C1≥C2 be satisfied. This is because by increasing C1, when the potential in the floating gate portion FG is controlled by the fifth wiring (e.g., at the time of reading), variation in the potential of the fifth wiring can be suppressed.

When the above relation is satisfied, a more favorable semiconductor device can be realized. Note that R1 and R2 are determined by the gate insulating layer included in the transistor 300 and the insulating layer included in the capacitor 320, respectively. Similarly, C1 and C2 are determined by the gate insulating layer included in the transistor 300 and the insulating layer included in the capacitor 320, respectively. Therefore, the material, the thickness, and the like of the gate insulating layer are desirably set as appropriate so that the above relation may be satisfied.

In the semiconductor device described in this embodiment, the floating gate portion FG has an effect similar to that of a floating gate of a floating-gate transistor in a flash memory or the like, but the floating gate portion FG of this embodiment has a feature essentially different from that of the floating gate in the flash memory or the like. In a flash memory, since voltage applied to a control gate is high, it is necessary to keep a proper distance between cells in order to prevent the potential from affecting a floating gate of the adjacent cell. This is one of the factors inhibiting high integration of the semiconductor device. The factor is due to a basic principle of a flash memory that tunneling current is generated by application of a high electric field.

Further, because of the above principle of a flash memory, deterioration of an insulating film proceeds and thus another problem about the limit on the number of times of rewriting (approximately $10^4$ to $10^5$ times) arises.

The semiconductor device according to the disclosed invention is operated by switching of a transistor including an oxide semiconductor and does not use the above principle of charge injection by tunneling current. That is, unlike a flash memory, a high electric field for charge injection is not necessary. Accordingly, an influence of a high electric field from a control gate on an adjacent cell does not need to be taken into account, and thus high integration can be facilitated.

Further, since charge injection by tunneling current is not utilized, there is no cause for deterioration of a memory cell.

In other words, the semiconductor device according to the disclosed invention has higher durability and reliability than a flash memory.

In addition, it is also advantage over a flash memory that a high electric field is unnecessary and a large peripheral circuit (such as a booster circuit) is unnecessary.

In the case where the relative permittivity ∈r1 of the insulating layer included in the capacitor 320 is different from the relative permittivity ∈r2 of the insulating layer forming a gate capacitance included in the transistor 300, it is easy to satisfy C1≥C2 while 2×S2≥S1 (desirably, S2≥S1) is satisfied where S1 is the area of the insulating layer included in the capacitor 320 and S2 is the area of an insulating layer forming gate capacitance of the transistor 300. In other words, C1 can easily be made greater than or equal to C2 while the area of the insulating layer included in the capacitor 320 is small. Specifically, for example, when a film formed of a high-k material such as hafnium oxide or a stack of a film formed of a high-k material such as hafnium oxide and a film formed of an oxide semiconductor is used for the insulating layer included in the capacitor 320, ∈r1 can be set to 10 or more, preferably 15 or more, and when a film formed of silicon oxide is used for the insulating layer forming the gate capacitance, ∈r2 can be set to 3 to 4.

Combination of such structures enables higher integration of the semiconductor device according to the disclosed invention.

Note that an n-channel transistor (an n-type transistor) in which electrons are majority carriers is used in the above description, but it will be appreciated that a p-channel transistor in which holes are majority carriers can be used instead of the n-channel transistor.

As described above, a semiconductor device according to an embodiment of the disclosed invention has a non-volatile memory cell including a write transistor in which leakage current (off-state current) between a source and a drain in an off state is small, a read transistor including a semiconductor material different from that of the write transistor, and a capacitor.

The off-state current of the write transistor is preferably 100 zA ($1\times10^{-19}$ A) or less, more preferably 10 zA ($1\times10^{-20}$ A) or less, still more preferably 1 zA ($1\times10^{-21}$ A) or less at an ambient temperature (e.g., 25° C.). It is difficult for a general silicon semiconductor to achieve a small off-state current as described above. In contrast, such a small off-state current can be achieved by a transistor obtained by processing an oxide semiconductor under an appropriate condition. Therefore, a transistor including an oxide semiconductor is preferably used as the write transistor.

In addition, a transistor including an oxide semiconductor has a small subthreshold swing (S value), so that the switching speed can be sufficiently high even if the mobility is relatively low. Therefore, by using the transistor as the write transistor, rise of a write pulse given to the floating gate portion FG can be very sharp. Further, since the off-state current of the transistor is small, the amount of charge held in the floating gate portion FG can be small. That is, by using a transistor including an oxide semiconductor as a write transistor, data can be rewritten at high speed.

As for the read transistor, although there is no limitation on off-state current, it is preferable to use a transistor which operates at high speed in order to increase the reading speed. For example, it is preferable to use a transistor with a switching speed of one nanosecond or less as the read transistor.

Data is written to the memory cell by turning on the write transistor and applying a potential to the floating gate portion FG where one of a source electrode and a drain electrode of the write transistor, one electrode of the capacitor, and a gate electrode of the read transistor are electrically connected to one another, and then turning off the write transistor so that the predetermined amount of charge is held in the floating gate portion FG. Here, the off-state current of the write transistor is very small; thus, the charge supplied to the floating gate portion FG is held for a long time. When the off-state current is, for example, substantially 0, refresh operation needed for a conventional DRAM becomes unnecessary or the frequency of refresh operation can be significantly low (for example, about once a month or a year). Accordingly, power consumption of a semiconductor device can be reduced sufficiently.

Further, data can be rewritten directly by writing data again to the memory cell. For that reason, erasing operation which is needed in a flash memory or the like is not needed, whereby a reduction in operation speed caused by erasing operation can be suppressed. In other words, high-speed operation of the semiconductor device can be realized. Moreover, high voltage which is needed for writing or erasing data in a conventional floating-gate transistor is not necessary; thus, power consumption of the semiconductor device can be further reduced. The highest voltage applied to the memory cell according to this embodiment (the difference between the highest potential and the lowest potential which are applied to terminals of the memory cell at the same time) can be 5 V or lower, preferably 3 V or lower, in each memory cell in the case where data of two levels (one bit) is written.

The memory cell provided in the semiconductor device according to the disclosed invention may include at least the write transistor, the read transistor, and the capacitor. Further, the memory cell can operate even when the area of the capacitor is small. Accordingly, the area of each memory cell can be sufficiently small as compared to, for example, an SRAM which requires six transistors in each memory cell; thus, the memory cells can be arranged in a semiconductor device at high density.

In a conventional floating-gate transistor, since charge passes through a gate insulating film (a tunnel insulating film) in writing operation, deterioration of the gate insulating film (the tunnel insulating film) cannot be avoided. In contrast, in the memory cell according to one embodiment of the present invention, data is written by switching operation of a write transistor; therefore, the problem of deterioration of the gate insulating film is eliminated. This means that there is no limit on the number of times of writing in principle and writing durability is very high. For example, in the memory cell according to one embodiment of the present invention, the current-voltage characteristic is not degraded even after data is written $1\times10^9$ (a billion) or more times.

Further, in the case of using a transistor including an oxide semiconductor as the write transistor of the memory cell, the current-voltage characteristic of the memory cell is not degraded even at a high temperature of, for example, 150° C. because an oxide semiconductor generally has a wide energy gap (e.g., 3.0 eV to 3.5 eV in the case of an In—Ga—Zn—O-based oxide semiconductor) and includes extremely few thermally excited carriers.

As a result of intensive research, the present inventors have found that a transistor including an oxide semiconductor has excellent properties in that characteristics do not deteriorate even at a high temperature of 150° C. and that the off-state current is smaller than or equal to 100 zA, which is extremely small. In this embodiment, by using such a transistor having excellent properties as the write transistor of the memory cell, a semiconductor device having a novel feature is provided.

According to one embodiment of the disclosed invention, a transistor including an oxide semiconductor can achieve miniaturization while suppressing defects and maintaining favorable characteristics. By using such a transistor, an excellent memory device as described above can be highly-integrated.

The structures, methods, and the like described in this embodiment can be combined as appropriate with any of the structures and methods described in the other embodiments.

Embodiment 3

In this embodiment, application examples of a semiconductor device according to one embodiment of the disclosed invention will be described with reference to FIGS. 6A and 6B and FIGS. 7A to 7C.

Figure 6A:
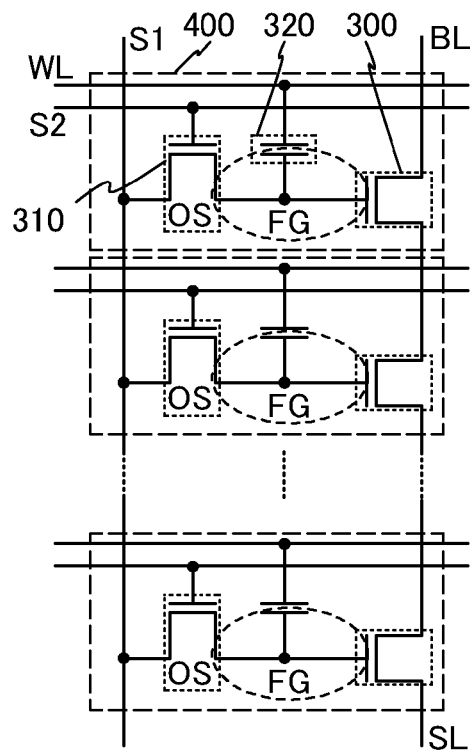
FIGS. 6A and 6B are examples of a circuit diagram of a semiconductor device.
Figure 6B:
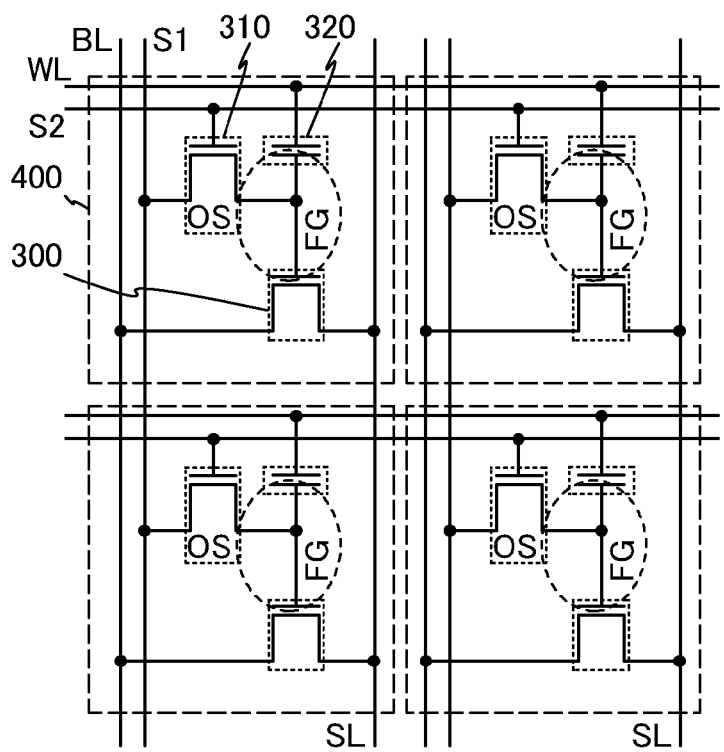

FIGS. 6A and 6B are circuit diagrams of semiconductor devices each including a plurality of semiconductor devices (hereinafter, also referred to as memory cells 400) illustrated in FIG. 5A. FIG. 6A is a circuit diagram of a so-called NAND semiconductor device in which the memory cells 400 are connected in series, and FIG. 6B is a circuit diagram of a so-called NOR semiconductor device in which the memory cells 400 are connected in parallel.

The semiconductor device in FIG. 6A includes a source line SL, a bit line BL, a first signal line S1, a plurality of second signal lines S2, a plurality of word lines WL, and a plurality of memory cells 400. In FIG. 6A, one source line SL and one bit line BL are provided in the semiconductor device; however, one embodiment of the disclosed invention is not limited to this structure. A plurality of source lines SL and a plurality of bit lines BL may be provided.

In the each memory cell 400, the gate electrode of the transistor 300, the one of the source electrode and the drain electrode of the transistor 310, and the one electrode of the capacitor 320 are electrically connected to one another. In addition, the first signal line S1 and the other of the source electrode and the drain electrode of the transistor 310 are electrically connected to each other, and the second signal line S2 and the gate electrode of the transistor 310 are electrically connected to each other. The word line WL and the other electrode of the capacitor 320 are electrically connected to each other.

Further, the source electrode of the transistor 300 in the memory cell 400 is electrically connected to a drain electrode of the transistor 300 in one adjacent memory cell 400. The drain electrode of the transistor 300 included in the memory cell 400 is electrically connected to a source electrode of the transistor 300 in another adjacent memory cell 400. Note that the drain electrode of the transistor 300 included in the memory cell 400 at one end of the plurality of memory cells connected in series is electrically connected to the bit line BL. In addition, the source electrode of the transistor 300 included in the memory cell 400 at the other end of the plurality of memory cells connected in series is electrically connected to the source line SL.

In the semiconductor device in FIG. 6A, writing operation and reading operation are performed for each row. The writing operation is performed as follows. A potential at which the transistor 310 is turned on is applied to the second signal line S2 of a row where writing is to be performed, whereby the transistor 310 of the row where writing is to be performed is turned on. Accordingly, a potential of the first signal line S1 is applied to the gate electrode of the transistor 300 of the specified row, whereby predetermined charge is given to the gate electrode. Thus, data can be written to the memory cell of the specified row.

The reading operation is performed as follows. First, a potential at which the transistors 300 are turned on regardless of the charge in the gate electrodes of the transistors 300 is applied to the word lines WL of rows other than a row where reading is to be performed, whereby the transistors 300 of the rows other than the row where reading is to be performed are turned on. Then, a potential (a read-out potential) at which an on state or an off state of the transistor 300 is determined depending on the charge in the gate electrode of the transistor 300 is applied to the word line WL of the row where reading is performed. After that, a fixed potential is applied to the source line SL and a read-out circuit (not illustrated) connected to the bit line BL is operated. Here, since the plurality of transistors 300 between the source line SL and the bit line BL are in an on state except the transistor 300 of the row where reading is performed, conductance between the source line SL and the bit line BL is determined by the state (an on state or an off state) of the transistor 300 of the row where reading is performed. Since the conductance of the transistor changes depending on the charge in the gate electrode of the transistor 300, a potential of the bit line BL changes accordingly. By reading out the potential of the bit line BL by the read-out circuit, data can be read out from the memory cell of the specified row.

The semiconductor device in FIG. 6B includes a plurality of source lines SL, a plurality of bit lines BL, a plurality of first signal lines S1, a plurality of second signal lines S2, a plurality of word lines WL, and a plurality of memory cells 400. The gate electrode of the transistor 300, the one of the source electrode and the drain electrode of the transistor 310, and the one electrode of the capacitor 320 are electrically connected to one another. In addition, the source line SL and the source electrode of the transistor 300 are electrically connected to each other, and the bit line BL and the drain electrode of the transistor 300 are electrically connected to each other. In addition, the first signal line S1 and the other of the source electrode and the drain electrode of the transistor 310 are electrically connected to each other, and the second signal line S2 and the gate electrode of the transistor 310 are electrically connected to each other. The word line WL and the other electrode of the capacitor 320 are electrically connected to each other.

In the semiconductor device in FIG. 6B, writing operation and reading operation are performed for each row. The writing operation is performed in a manner similar to that of the semiconductor device in FIG. 6A. The reading operation is performed as follows. First, a potential at which the transistors 300 are turned off regardless of the charge supplied to the gate electrodes of the transistors 300 is applied to the word lines WL of rows other than a row where reading is to be performed, whereby the transistors 300 of the rows other than the row where reading is to be performed are turned off. Then, a potential (a read-out potential) at which an on state or an off state of the transistor 300 is determined depending on the charge in the gate electrode of the transistor 300 is supplied to the word line WL of the row where reading is performed. After that, a fixed potential is applied to the source line SL and a read-out circuit (not illustrated) connected to the bit line BL is operated. Here, conductance between the source line SL and the bit line BL is determined by the state (an on state or an off state) of the transistor 300 of the row where reading is performed. That is, a potential of the bit lines BL changes depending on the charge in the gate electrode of the transistor 300 of the row where reading is to be performed. By reading out the potential of the bit line BL by the read-out circuit, data can be read out from the memory cell of the specified row.

Although the amount of data which can be held in each memory cell 400 is one bit in the above description, the structure of the memory device of this embodiment is not limited to this. The amount of data which is held in each memory cell 400 may be increased by preparing three or more levels of potential to be applied to the gate electrode of the transistor 300. For example, in the case where four levels of potential are applied to the gate electrode of the transistor 300, two-bit data can be held in each memory cell.

Next, examples of a read-out circuit which can be used for the semiconductor devices in FIGS. 6A and 6B or the like will be described with reference to FIGS. 7A to 7C.

Figure 7A:
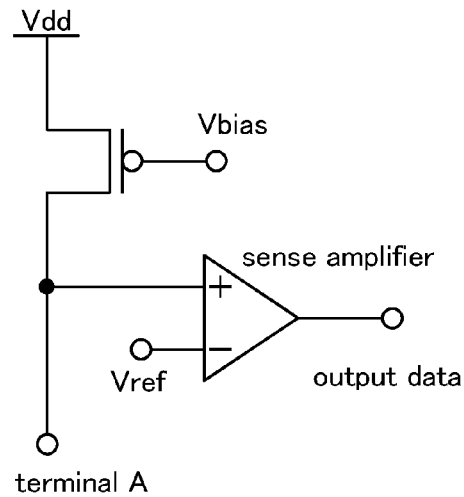
FIGS. 7A to 7C are examples of a circuit diagram of a semiconductor device.

FIG. 7A is a schematic view of a read-out circuit. The read-out circuit includes a transistor and a sense amplifier circuit.

At the time of reading data, a terminal A is connected to a bit line to which a memory cell from which data is to be read is connected. Further, a bias potential Vbias is applied to a gate electrode of the transistor to control a potential of the terminal A.

The resistance of the memory cell 400 changes depending on stored data. Specifically, when the transistor 300 in the selected memory cell 400 is on, the memory cell 400 has low resistance, whereas when the transistor 300 in the selected memory cell 400 is off, the selected memory cell 400 has high resistance.

When the memory cell has high resistance, the potential of the terminal A is higher than a reference potential Vref and the sense amplifier circuit outputs a potential corresponding to the potential of the terminal A. On the other hand, when the memory cell has low resistance, the potential of the terminal A is lower than the reference potential Vref and the sense amplifier circuit outputs a potential corresponding to the potential of the terminal A.

Thus, with the read-out circuit, data can be read out from the memory cell. Note that the read-out circuit in this embodiment is an example. Another circuit may be used. The read-out circuit may further include a precharge circuit. Instead of the reference potential Vref, a reference bit line may be connected to the sense amplifier circuit.

Figure 7B:
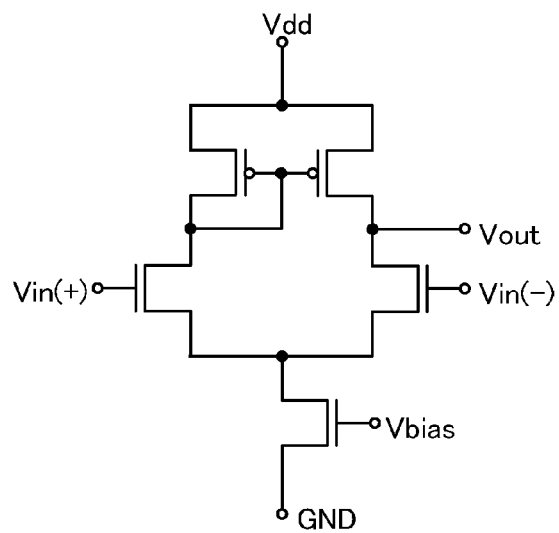

FIG. 7B illustrates a differential sense amplifier which is an example of a sense amplifier circuit. The differential sense amplifier has an input terminal Vin(+), an input terminal Vin(−), and an output terminal Vout, and amplifies the potential difference between Vin(+) and Vin(−). Vout outputs a High signal when the potential of Vin(+) is higher than the potential of Vin(−), and outputs a Low signal when the potential of Vin(+) is lower than the potential of Vin(−). When the differential sense amplifier is used for the read-out circuit, one of Vin(+) and Vin(−) is connected to the terminal A, and the reference potential Vref is applied to the other of Vin(+) and Vin(−).

Figure 7C:
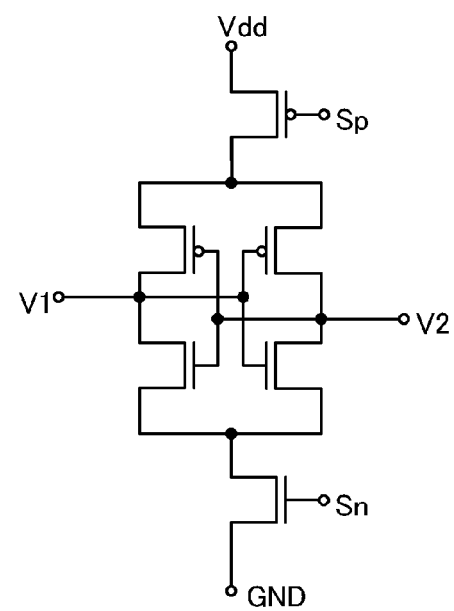

FIG. 7C illustrates a latch sense amplifier which is an example of a sense amplifier circuit. The latch sense amplifier includes input/output terminals V1 and V2 and input terminals of control signals Sp and Sn. First, the control signals Sp and Sn are set to High and Low, respectively, and a power supply potential (Vdd) is cut off. Then, potentials to be compared are applied to V1 and V2. After that, the control signals Sp and Sn are set to Low and High, respectively, and a power supply potential (Vdd) is applied. If the potential of V1 is higher than the potential of V2, output of the V1 is High and output of the V2 is Low, whereas if the potential of V1 is lower than the potential of V2, output of V1 is Low and output of V2 is High. By utilizing such a relation, the potential difference between V1 and V2 can be amplified. When the latch sense amplifier is used for the read-out circuit, one of V1 and V2 is connected to the terminal A and the output terminal through a switch, and the reference potential Vref is applied to the other of V1 and V2.

The structures, methods, and the like described in this embodiment can be combined as appropriate with any of the structures and methods described in the other embodiments.

Embodiment 4

In this embodiment, the case where the semiconductor device described in any of the above embodiments is applied to an electronic device will be described with reference to FIGS. 8A to 8F. In this embodiment, the case where the above semiconductor device is applied to an electronic device such as a computer, a mobile phone (also referred to as a mobile telephone or a mobile telephone device), a portable information terminal (including a portable game console, an audio player, and the like), a digital camera, a digital video camera, an electronic paper, or a television device (also referred to as a television or a television receiver) will be described.

Figure 8A:
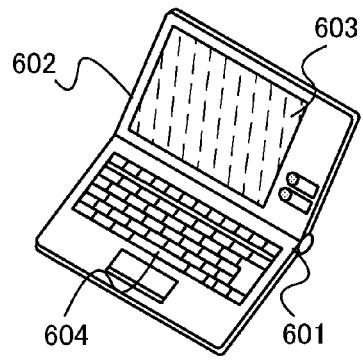
FIGS. 8A to 8F illustrate examples of electronic devices.

FIG. 8A is a notebook personal computer including a housing 601, a housing 602, a display portion 603, a keyboard 604, and the like. The miniaturized semiconductor device described in any of the above embodiments is provided in the housing 601 and the housing 602. Consequently, a notebook personal computer having characteristics of being small, high-speed operation, and low power consumption can be realized.

Figure 8D:
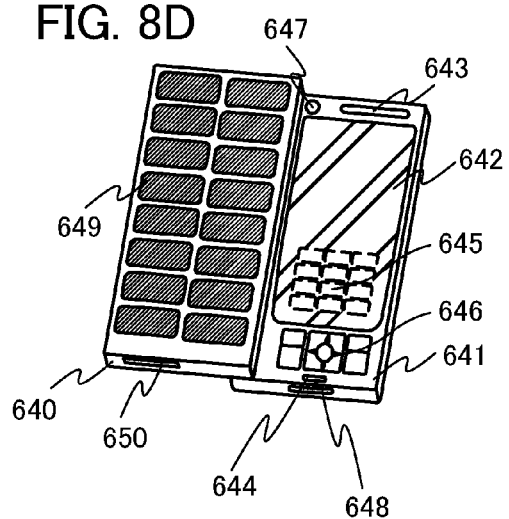
Figure 8B:
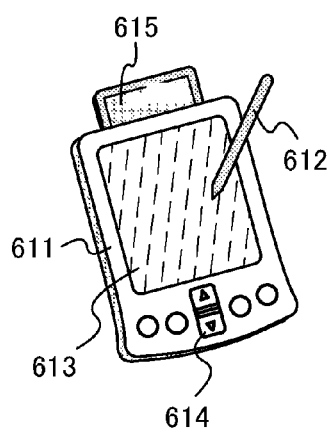

FIG. 8B is a portable information terminal (personal digital assistant (PDA)). A main body 611 is provided with a display portion 613, an external interface 615, operation buttons 614, and the like. Further, a stylus 612 for operating the portable information terminal or the like is also provided. The miniaturized semiconductor device described in any of the above embodiments is provided in the main body 611. Consequently, a portable information terminal having characteristics of being small, high-speed operation, and low power consumption can be realized.

Figure 8E:
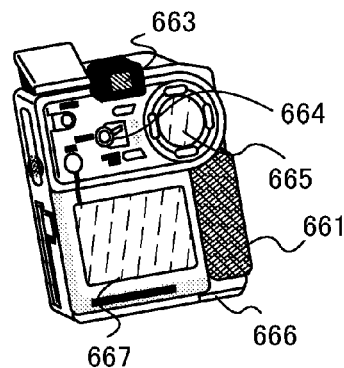
Figure 8C:
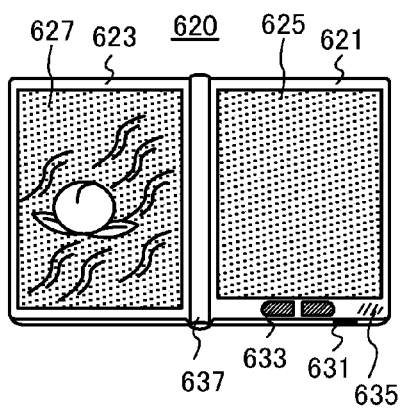

FIG. 8C is an e-book reader 620 mounting an electronic paper. The e-book reader has two housings, a housing 621 and a housing 623. The housing 621 and the housing 623 are provided with a display portion 625 and a display portion 627, respectively. The housing 621 and the housing 623 are connected by a hinge 637 and can be opened and closed along the hinge 637. Further, the housing 621 is provided with a power switch 631, operation keys 633, a speaker 635, and the like. At least one of the housing 621 and the housing 623 is provided with the miniaturized semiconductor device described in any of the above embodiments. Consequently, an e-book reader having characteristics of being small, high-speed operation, and low power consumption can be realized.

FIG. 8D is a mobile phone including two housings, a housing 640 and a housing 641. Further, the housing 640 and the housing 641 which are in a state where they are opened as illustrated in FIG. 8D can be slid so that one is lapped over the other and the size of the mobile phone can be reduced, which makes the mobile phone suitable for being carried. The housing 641 is provided with a display panel 642, a speaker 643, a microphone 644, a pointing device 646, a camera lens 647, an external connection terminal 648, and the like. The display panel 642 has a function as a touch screen. Operation keys 645 which are displayed are illustrated by dashed lines in FIG. 8D. The housing 640 is provided with a solar cell 649 that charges the mobile phone, an external memory slot 650, and the like. In addition, an antenna is incorporated in the housing 641. At least one of the housing 640 and the housing 641 is provided with the miniaturized semiconductor device described in any of the above embodiments. Consequently, a mobile phone having characteristics of being small, high-speed operation, and low power consumption can be realized.

FIG. 8E is a digital camera including a main body 661, a display portion 667, an eyepiece 663, an operation switch 664, a display portion 665, a battery 666, and the like. The miniaturized semiconductor device described in any of the above embodiments is provided in the main body 661. Consequently, a digital camera having characteristics of being small, high-speed operation, and low power consumption can be realized.

Figure 8F:
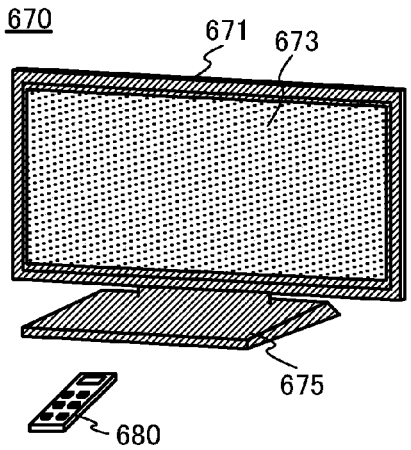

FIG. 8F is a television device 670 including a housing 671, a display portion 673, a stand 675, and the like. The television device 670 can be operated by an operation switch of the housing 671 or a remote control 680. The miniaturized semiconductor device described in any of the above embodiments is mounted in the housing 671 and the remote control 680. Consequently, a television device having characteristics of being small, high-speed operation, and low power consumption can be realized.

Thus, the semiconductor device according to any of the above embodiments is mounted in the electronic devices described in this embodiment. Accordingly, electronic devices having characteristics of being small, high-speed operation, and low power consumption can be realized.

This application is based on Japanese Patent Application serial no. 2010-043137 filed with Japan Patent Office on Feb. 26, 2010, the entire contents of which are hereby incorporated by reference.

The invention claimed is:
1. A semiconductor device comprising:
   a semiconductor layer;
   a source electrode comprising:
      a first conductive layer; and
      a second conductive layer in contact with the semiconductor layer;
   a drain electrode comprising:
      a third conductive layer; and
      a fourth conductive layer in contact with the semiconductor layer;
   a first sidewall insulating layer in contact with the source electrode;
   a second sidewall insulating layer in contact with the drain electrode;
   a gate electrode overlapping with the semiconductor layer; and
   a gate insulating layer between the semiconductor layer and the gate electrode,
   wherein the second conductive layer has a first region which extends beyond an end portion of the first conductive layer in a channel length direction and which overlaps with part of the gate electrode,
   wherein the fourth conductive layer has a second region which extends beyond an end portion of the third conductive layer in the channel length direction and which overlaps with part of the gate electrode,
   wherein the first sidewall insulating layer is provided on the first region,
   wherein the second sidewall insulating layer is provided on the second region,
   wherein the first sidewall insulating layer and the second sidewall insulating layer each comprise a nitride insulating layer and an oxide insulating layer, and
   wherein the nitride insulating layer extends beyond an end portion of the oxide insulating layer.

2. The semiconductor device according to claim 1,
   wherein the oxide insulating layer is provided over the nitride insulating layer.
3. The semiconductor device according to claim 1,
   wherein the nitride insulating layer comprises silicon nitride, silicon nitride oxide, or aluminum nitride, and
   wherein the oxide insulating layer comprises silicon oxide, silicon oxynitride, or aluminum oxide.
4. The semiconductor device according to claim 1,
   wherein the first conductive layer and the second conductive layer each have a tapered shape, and
   wherein the third conductive layer and the fourth conductive layer each have a tapered shape.
5. The semiconductor device according to claim 1,
   wherein the second conductive layer and the fourth conductive layer each comprise nitride of a metal.
6. The semiconductor device according to claim 1,
   wherein the second conductive layer and the fourth conductive layer each have a thickness of greater than or equal to 5 nm and less than or equal to 15 nm.
7. The semiconductor device according to claim 1, further comprising:
   a third insulating layer provided between the semiconductor layer and a top surface of the source electrode; and
   a fourth insulating layer provided between the semiconductor layer and a top surface of the drain electrode,
   wherein the source electrode and the drain electrode are in contact with the semiconductor layer at end portions of the source electrode and the drain electrode.
8. The semiconductor device according to claim 1,
   wherein the first sidewall insulating layer is in contact with the semiconductor layer and has a curved surface at least partly in a region in contact with the semiconductor layer, and
   wherein the second sidewall insulating layer is in contact with the semiconductor layer and has a curved surface at least partly in a region in contact with the semiconductor layer.
9. The semiconductor device according to claim 1,
   wherein the semiconductor device is one selected from the group consisting of a personal computer, a personal digital assistant, an e-book reader, a mobile phone, a digital camera, and a television device.
10. A semiconductor device comprising:
   a semiconductor layer;
   a source electrode comprising:
      a first conductive layer; and
      a second conductive layer in contact with the semiconductor layer;
   a drain electrode comprising:
      a third conductive layer; and
      a fourth conductive layer in contact with the semiconductor layer;
   a first sidewall insulating layer in contact with the source electrode;
   a second sidewall insulating layer in contact with the drain electrode;
   a gate electrode overlapping with the semiconductor layer; and
   a gate insulating layer between the semiconductor layer and the gate electrode,
   wherein the second conductive layer has a first region which extends beyond an end portion of the first conductive layer in a channel length direction and which overlaps with part of the gate electrode,
   wherein the fourth conductive layer has a second region which extends beyond an end portion of the third conductive layer in the channel length direction and which overlaps with part of the gate electrode, wherein the first sidewall insulating layer is provided on the first region, wherein the second sidewall insulating layer is provided on the second region, wherein the first sidewall insulating layer and the second sidewall insulating layer each comprise a nitride insulating layer and an oxide insulating layer, wherein the nitride insulating layer extends beyond an end portion of the oxide insulating layer, and wherein the semiconductor layer is an oxide semiconductor layer.

11. The semiconductor device according to claim 10, wherein the oxide insulating layer is provided over the nitride insulating layer.

12. The semiconductor device according to claim 10, wherein the nitride insulating layer comprises silicon nitride, silicon nitride oxide, or aluminum nitride, and wherein the oxide insulating layer comprises silicon oxide, silicon oxynitride, or aluminum oxide.

13. The semiconductor device according to claim 10, wherein the first conductive layer and the second conductive layer each have a tapered shape, and wherein the third conductive layer and the fourth conductive layer each have a tapered shape.

14. The semiconductor device according to claim 10, wherein the second conductive layer and the fourth conductive layer each comprise nitride of a metal.

15. The semiconductor device according to claim 10, wherein the second conductive layer and the fourth conductive layer each have a thickness of greater than or equal to 5 nm and less than or equal to 15 nm.

16. The semiconductor device according to claim 10, further comprising:
a third insulating layer provided between the semiconductor layer and a top surface of the source electrode; and
a fourth insulating layer provided between the semiconductor layer and a top surface of the drain electrode,
wherein the source electrode and the drain electrode are in contact with the semiconductor layer at end portions of the source electrode and the drain electrode.

17. The semiconductor device according to claim 10, wherein the first sidewall insulating layer is in contact with the semiconductor layer and has a curved surface at least partly in a region in contact with the semiconductor layer, and
wherein the second sidewall insulating layer is in contact with the semiconductor layer and has a curved surface at least partly in a region in contact with the semiconductor layer.

18. The semiconductor device according to claim 10, wherein the semiconductor device is one selected from the group consisting of a personal computer, a personal digital assistant, an e-book reader, a mobile phone, a digital camera, and a television device.

19. A semiconductor device comprising:
a semiconductor layer;
a source electrode comprising:
 a first conductive layer; and
 a second conductive layer in contact with the semiconductor layer;
a drain electrode comprising:
 a third conductive layer; and
 a fourth conductive layer in contact with the semiconductor layer;
a first sidewall insulating layer in contact with the source electrode;
a second sidewall insulating layer in contact with the drain electrode;
a gate electrode overlapping with the semiconductor layer; and
a gate insulating layer between the semiconductor layer and the gate electrode,
wherein the second conductive layer has a first region which extends beyond an end portion of the first conductive layer in a channel length direction and which overlaps with part of the gate electrode,
wherein the fourth conductive layer has a second region which extends beyond an end portion of the third conductive layer in the channel length direction and which overlaps with part of the gate electrode,
wherein the first sidewall insulating layer is provided on the first region,
wherein the second sidewall insulating layer is provided on the second region,
wherein the first sidewall insulating layer and the second sidewall insulating layer each comprise a nitride insulating layer and an oxide insulating layer,
wherein the nitride insulating layer extends beyond an end portion of the oxide insulating layer, and
wherein a material included in the second conductive layer has higher resistance than a material included in the first conductive layer.

20. The semiconductor device according to claim 19, wherein the oxide insulating layer is provided over the nitride insulating layer.

21. The semiconductor device according to claim 19, wherein the nitride insulating layer comprises silicon nitride, silicon nitride oxide, or aluminum nitride, and wherein the oxide insulating layer comprises silicon oxide, silicon oxynitride, or aluminum oxide.

22. The semiconductor device according to claim 19, wherein the first conductive layer and the second conductive layer each have a tapered shape, and
wherein the third conductive layer and the fourth conductive layer each have a tapered shape.

23. The semiconductor device according to claim 19, wherein the second conductive layer and the fourth conductive layer each comprise nitride of a metal.

24. The semiconductor device according to claim 19, wherein the second conductive layer and the fourth conductive layer each have a thickness of greater than or equal to 5 nm and less than or equal to 15 nm.

25. The semiconductor device according to claim 19, further comprising:
a third insulating layer provided between the semiconductor layer and a top surface of the source electrode; and
a fourth insulating layer provided between the semiconductor layer and a top surface of the drain electrode,
wherein the source electrode and the drain electrode are in contact with the semiconductor layer at end portions of the source electrode and the drain electrode.

26. The semiconductor device according to claim 19, wherein the first sidewall insulating layer is in contact with the semiconductor layer and has a curved surface at least partly in a region in contact with the semiconductor layer, and
wherein the second sidewall insulating layer is in contact with the semiconductor layer and has a curved surface at least partly in a region in contact with the semiconductor layer.

27. The semiconductor device according to claim 19, wherein the semiconductor layer is an oxide semiconductor layer.

28. The semiconductor device according to claim 19, wherein the semiconductor device is one selected from the group consisting of a personal computer, a personal digital assistant, an e-book reader, a mobile phone, a digital camera, and a television device.

* * * * *